(12) United States Patent
Ikehashi et al.

(10) Patent No.: US 6,643,180 B2
(45) Date of Patent: Nov. 4, 2003

(54) SEMICONDUCTOR MEMORY DEVICE WITH TEST MODE

(75) Inventors: Tamio Ikehashi, Yokohama (JP); Ken Takeuchi, Tokyo (JP); Toshihiko Himeno, Yokohama (JP)

(73) Assignee: Kabushiki Kaisha Toshiba, Minato-Ku (JP)

( * ) Notice: Subject to any disclaimer, the term of this patent is extended or adjusted under 35 U.S.C. 154(b) by 0 days.

(21) Appl. No.: 09/968,706

(22) Filed: Oct. 2, 2001

(65) Prior Publication Data

US 2002/0048191 A1 Apr. 25, 2002

(30) Foreign Application Priority Data

Oct. 3, 2000 (JP) ........................................ 2000-303854

(51) Int. Cl.[7] .............................................. G11C 16/06
(52) U.S. Cl. ......................... 365/185.22; 365/185.09; 365/189.12; 365/200
(58) Field of Search ................................. 365/200, 201, 365/230.03, 230.06, 221, 189.02, 189.05, 189.12, 185.22, 185.19, 185.09; 714/710, 711, 718, 42

(56) References Cited

U.S. PATENT DOCUMENTS 5,808,944 A * 9/1998 Yoshitake et al. .......... 365/200
6,065,141 A * 5/2000 Kitagawa ................... 714/711
6,094,373 A * 7/2000 Saito ...................... 365/185.22
6,118,710 A * 9/2000 Tsuji ........................... 365/200
6,449,182 B1 * 9/2002 Ooishi ........................ 365/63
6,462,985 B2 * 10/2002 Hosono et al. ......... 365/185.09

FOREIGN PATENT DOCUMENTS

JP        2000-149588 A        5/2000

* cited by examiner

Primary Examiner—David Nelms
Assistant Examiner—Gene N. Anduong
(74) Attorney, Agent, or Firm—Banner & Witcoff, Ltd.

(57) ABSTRACT

In a method of testing a nonvolatile semiconductor memory integrated on a semiconductor chip comprising a memory cell array, a first register that stores an address of a defective region in the memory cell array, a plurality of internal voltage generator circuits, and a second register, the second register storing a trimming value for setting an internal voltage value generated by each of the internal voltage generator circuits, the testing method carries out resetting the address of the defective region stored in the first register and the trimming value stored in the second register, and setting the address of the defective region stored in the first register and the trimming value stored in the second register to a value according to a property of each of the semiconductor chips, wherein the testing is carried out without turning a power supply off after the power supply has been turned on.

7 Claims, 23 Drawing Sheets

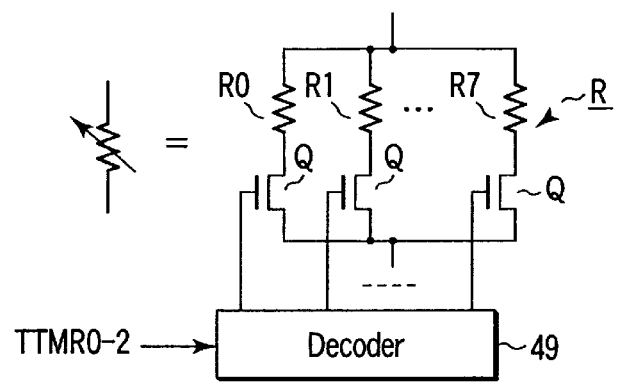
FIG. 7
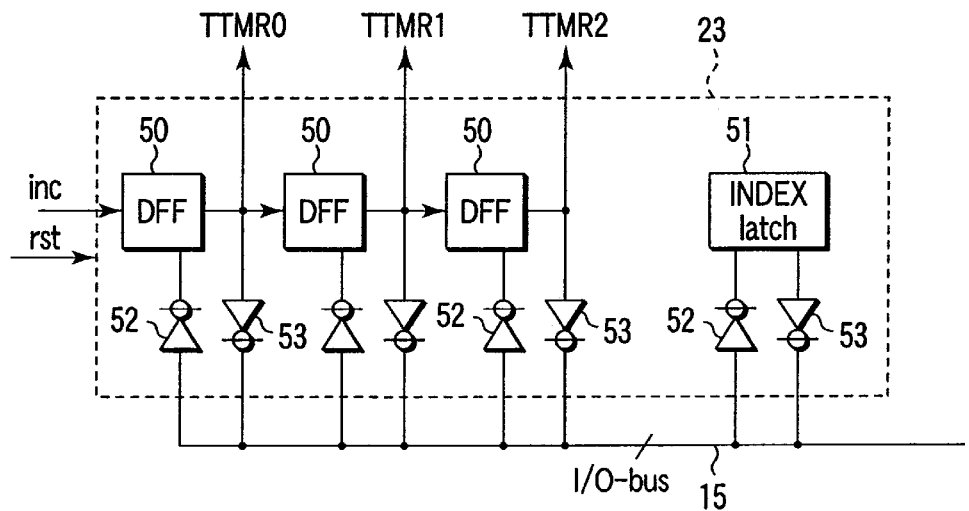
FIG. 8
| TTMR2 | TTMR1 | TTMR0 | INDEX | ΔTint |
|---|---|---|---|---|
| 0 | 1 | 1 | 0 | 0% |
| inc ↙ 0 | 0 | 0 | 1 | -30% |
| inc ↙ 0 | 0 | 1 | 1 | -20% |
| inc ↙ 0 | 1 | 0 | 1 | -10% |
| inc ↙ 0 | 1 | 1 | 1 | 0% |
| inc ↙ ⋮ | ⋮ | ⋮ | ⋮ | ⋮ |
| inc ↙ 1 | 1 | 0 | 1 | 30% |
| inc ↙ 1 | 1 | 1 | 1 | 40% |
FIG. 9

A: Testing Start Command
B: Register Control Command
FF*: Testing End Command

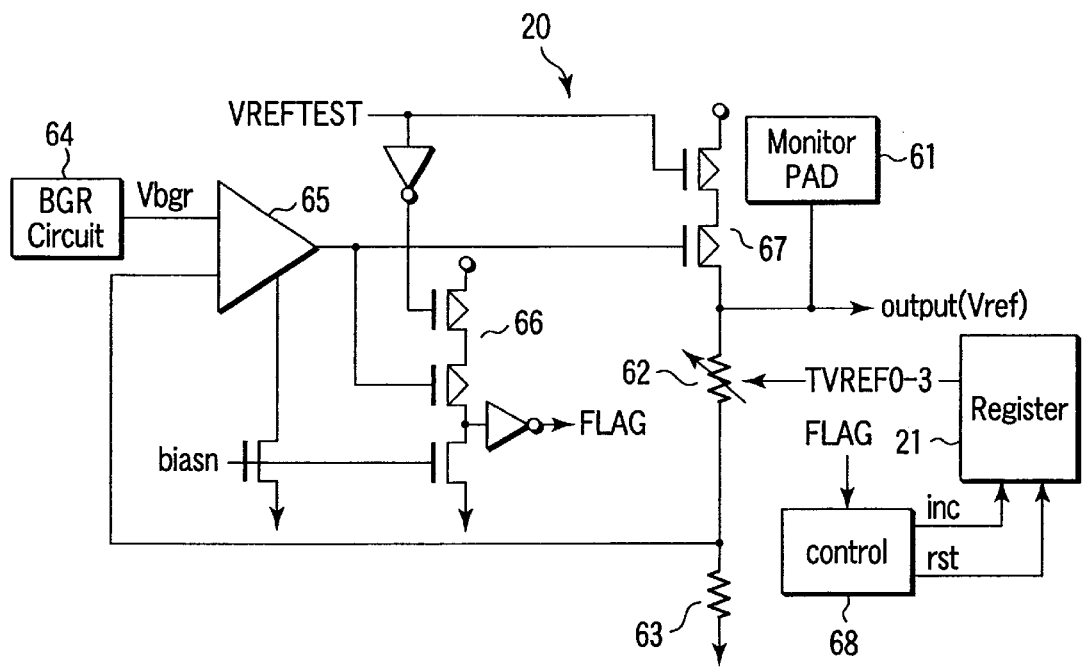
F I G. 13
| TVREF3 | TVREF2 | TVREF1 | TVREF0 | INDEX | Vref |
|---|---|---|---|---|---|
| 0 | 1 | 1 | 1 | 0 | 1.00V |
| inc 0 | 0 | 0 | 0 | 1 | 0.86V |
| inc 0 | 0 | 0 | 1 | 1 | 0.88V |
| inc 0 | 0 | 1 | 0 | 1 | 0.90V |
| 0 | 0 | 1 | 1 | 1 | 0.92V |
| inc ⋮ | ⋮ | ⋮ | ⋮ | ⋮ | ⋮ |
| inc 1 | 1 | 1 | 0 | 1 | 1.14V |
| 1 | 1 | 1 | 1 | 1 | 1.16V |
F I G. 14

A: Testing Start Command
B: Register Control Command
FF*: Testing End Command

SEMICONDUCTOR MEMORY DEVICE WITH TEST MODE

CROSS-REFERENCE TO RELATED APPLICATIONS

This application is based upon and claims the benefit of priority from the prior Japanese Patent Application No. 2000-303854, filed Oct. 3, 2000, the entire contents of which are incorporated herein by reference.

BACKGROUND OF THE INVENTION

1. Field of the Invention

The present invention relates to a semiconductor device having a pulse generator circuit and an internal voltage generator circuit, the semiconductor device being capable of adjusting values of a pulse width of the pulse generated by these circuits and a value of an internal voltage. More particularly, the present invention relates to a nonvolatile semiconductor memory that internally generates a reference voltage, a writing voltage, a erasure voltage, and a readout voltage.

2. Description of the Related Art

An NAND type flash memory that is one type of nonvolatile semiconductor memory is announced by literature such as K. Imamiya et. al. "A 130-$mm^2$ 256-Mb NAND Flash with Shallow Trench Isolation Technology", IEEE, J. Solid State Circuits, Vol. 34, pp. 1536–1543. November 1999" or the like.

In such a nonvolatile semiconductor memory, voltage trimming and defective cell redundancy replacement are carried out in a wafer test process.

FIG. 35 is a flowchart showing an outline of a conventional wafer testing process. The operating contents of each process are as follows.

In a DC test, DC checks such as contact check and standby current are made. In Vref (reference voltage) trimming, Wref of each chip on a wafer is monitored, and then, it is computed as to what a trimming value should be determined inn order to correct these to a target value.

Next, Vpgm (writing voltage) initial value trimming is carried out. In a NAND type flash memory, there is employed Incremental Step Pulse Programming Scheme that increments a writing voltage Vpgm from an initial value in a stepwise manner. This method is described in "K. D. Suh et. al., "A 3.3 V 32 Mb NAND Flash Memory with Incremental Step Pulse Programming Scheme", "ISSCC Digest of Technical Papers, pp. 128–129, February 1995", for example. In this writing method, it is required to optimize an initial value of Vpgm in order to ensure that a write time (or write loop count) is included within a predetermined time (count). For that purpose, it is required to find a block (good block) that can be written and erased from the inside of a memory cell array. This is because redundancy replacement of a defective cell is not carried out at this step.

If a good block is found, writing is carried in that block while an initial value of Vpgm is changed, and an optimal value is determined.

Subsequently, voltage trimming fuse cutting is carried out. At this step, a wafer is moved to a laser blow unit, and fuse cutting is carried out according to the above Vref trimming and a trimming value determined by Vpgm initial value trimming.

Subsequently, defective column/row detection is carried out. Here, for redundancy replacement, some data patterns are written into a memory cell array, and a defective column/row is detected.

Next, redundancy fuse cutting is carried out. Here, a wafer is moved to a laser flow unit again, and fuse cutting of redundancy replacement is carried out.

In this flowchart, voltage trimming fuse cutting is carried out before detecting a defective column/row because there is a possibility that, if defective column/row detection is carried out in a state in which an internally generated voltage such as Vpgm is shafted, a defect cannot be found.

A testing time at the above described wafer testing step is reflected in chip cost. Therefore, in order to reduce a chip cost, it is required to reduce a test time to the minimum while required wafer testing is carried out.

At the above described wafer test step, there are two factors that a test time is increased. One lies in the existence of a fuse cut step itself. In order to carry out fuse cutting by means of laser blowing, it is required to remove a wafer from a tester, and move the wafer to a laser blow unit. Here, a time overhead is produced. At the above described wafer test step, in particular, it is required to carry out fuse cutting separately twice, thus making the overhead more significant.

The second factor lies in a tester computation time, in order to reduce a test time, commands are assigned to about 100 chips at the same time at the wafer test step, and a tester is used such that an output can be measured at the same time. However, such a tester cannot carry out completely in parallel an operation for computing a trimming value from a monitored voltage or an operation for detecting a defective column row from a readout data pattern. A maximum of 10 chips can be processed in parallel. Therefore, even if data for 100 chips can be acquired at the same time, operational processing for such data must be carried out by being divided by 10 times, and here, a time overhead occurs.

A method for reducing a time for the fuse cutting step of the above two factors is described by the invention relating to application of Japanese Patent Application Publication No. 11-351396 made by the Applicant. The outline is given below.

In a nonvolatile semiconductor memory, a memory cell can store information in a nonvolatile manner. Thus, if a voltage trimming value or redundancy information is stored in a memory cell array, fuse and fuse cutting step can be eliminated. When a nonvolatile semiconductor memory is placed in a normal operation state, although it is required to store the previous trimming value or redundancy information in a predetermined register, the storage operation, i.e., an operation for acquiring information from the inside of a memory cell array, thereby storing the information in a register may be carried out at a time when a power is supplied to a nonvolatile semiconductor memory.

BRIEF SUMMARY OF THE INVENTION

According to an aspect of the present invention, there is provided a semiconductor device comprising:
 a bit line;
 a plurality of memory cells connected to the bit line; and
 a sense amplifier connected to one end of the bit line; and
 a defect detector circuit configured to read out data by the sense amplifier while setting a plurality of memory cells connected to the bit line all to a non-selected state, and the other end of the bit line being connected to a predetermined potential via a switch, and an open-circuit defect of the bit line being detected according to a readout data by the sense amplifier.

According to another aspect of the present invention, there is provided a semiconductor device comprising:

a memory cell array in which programmable and erasable nonvolatile memory cells are arranged in column and row directions of a matrix;

an address register that can store an address of a unit of memory cells which are programmed and erased simultaneously in the memory cell array; and a control circuit that carries out an erase verify operation configured to output a "pass" or "fail" signal according to whether or not all the memory cells targeted for erasing are erased, a write verify operation configured to output the "pass" or "fail" signal according to whether or not all the memory cells targeted for writing are written, and an operation activated upon receipt of a first command, for, when either of results of the erase verify and write verify operations is "fail", changing data of the address register, and when the results are "pass", disabling change of data of the address register.

According to a further aspect of the present invention, there is provided a semiconductor device comprising a register activated by a command input, the register having plural types of test operations configured to output a "pass" or "fail" signal, wherein, if a result of an immediately preceding test that has been carried out of the test operations is "pass", no data is changed, and if the result is "fail", data is set in a predetermined signal state.

According to a further aspect of the present invention, there is provided a semiconductor device having erase verify and write verify functions comprising:

memory cells;

an address register that can store an address of a unit of memory cells which are programmed and erased simultaneously in the memory cell array;

a first register that stores a "pass" and "fail" result after an erase verify operation;

a second register that stores a "pass" and "fail" result after a write verify operation;

a third register provided for each erase unit, the third register configured to store a first or second signal state according to whether or not the memory cells in the erase unit are write-erasable or not; and a control circuit activated upon receipt of a first command input, the control circuit making an operation such that, when at least one of the first register data and second register data is "fail", a third register corresponding to an address selected by the address register is set to a first signal state, and when both of the first register data and second register data are "pass", the third register is set to a second signal state.

According to a further aspect of the present invention, there is provided a semiconductor device comprising:

an internal circuit whose operation or function changes based on data stored in a register; and a control circuit that repeatedly makes a first operation to carry out a self-judgment test for the internal circuit such that a result of either of "pass" and "fail" is outputted and a second operation to carry out a different control for the register according to the "pass" or "fail" result in the self-judgment test, wherein data reflecting the characteristics of each semiconductor device is set to the register.

According to a further aspect of the present invention, there is provided a semiconductor device comprising:

an internal circuit in which an output is trimmed in $2^N$ different schemes by a register capable of holding N-bit data (where N denotes a positive integer); and a data setting circuit that judges in a first test the output of the internal circuit while the N-bit data is placed in a first state, to determine most significant bit data of the N-bit data; judges, in a kth test (k=2, 3, . . . N), while data from the most significant bit to a (k−1)th bit is maintained to a value determined in a first to (k−1)th test, the output of the internal circuit with the remaining bit being placed in a predetermined value to determine a kth bit data; and sets data reflecting characteristics of each semiconductor device to the register by the N tests.

According to a further aspect of the present invention, there is provided a semiconductor device comprising:

a memory cell array having a column region and a row region in which memory cells are arranged in column and row directions of a matrix;

a redundancy column region having M redundancy columns for replacement with a defective column in the memory cell array;

M registers configured to store column addresses to be replaced with the redundancy columns, each of the M registers including a latch placed to a first or second signal state according to whether or not a corresponding redundancy column can be used;

a sense amplifier;

a counter that selects the M registers sequentially;

a judgment circuit that makes a judgment on whether or not data of a selected column outputted from the sense amplifier coincides with a predetermined expected value and outputs a "pass" or "fail" signal according to a result of the judgment; and a control circuit that sets a column address and the counter to a start address, when a defective column in the memory cell array is to be detected; makes, if an output of the judgment circuit is "pass", an increment of the column address, and, if the output of the judgment circuit is "fail" and the latch of the register selected by the counter is placed in the first signal state, stores the column address in the register and thereafter making an increment of the column address and the counter; makes an increment of the counter until the counter has reached a register whose latch is placed in the first signal state, if the output of the judgment circuit is "fail" and the latch of the register selected by the counter is placed in the second signal state, thereafter, stores the column address in the register, and thereafter, makes an increment of the column address and the counter, and performs the operations until the counter has reached an end column address.

According to a further aspect of the present invention, there is provided a semiconductor device comprising:

a memory cell array in which programmable and erasable nonvolatile memory cells are arranged in column and row directions of a matrix;

a sense amplifier;

a bit line extending in the column direction, configured to transmit data of the memory cell array to the sense amplifier; and a column defect detecting circuit that detects a defective column of the memory cell array, without carrying out writing and erasing operation for the memory cells.

According to a further aspect of the present invention, there is provided a method of testing a semiconductor device, the semiconductor device comprising: a memory cell array in which programmable and erasable nonvolatile memory cells are arranged in column and row directions of a matrix; an address register that can store an address of a unit of memory cells which are programmed and erased simultaneously in the memory cell array; and a control circuit that carries out an erase verify operation for outputting a "pass" or "fail" signal according to whether or not all the memory cells targeted for erasing are erased, a write verify operation for outputting the "pass" or "fail" signal according to whether or not all the memory cells targeted for writing are written, and an operation activated upon receipt of a first command, for, when either of results of the erase verify and write verify operations is "fail", changing data of the address register, and when the results are "pass", disabling change of data of the address register, wherein in the method of testing a semiconductor device, series of operations comprising an erasing operation, an erase verify operation, a writing operation, a write verify operation and the first command input are repeated a plurality of times, to find a write-erasable region in a memory cell array.

According to a further aspect of the present invention, there is provided a method of testing a semiconductor device, the semiconductor device comprising a register activated by a command input, the register having plural types of test operations for outputting a "pass" or "fail" signal, wherein, if a result of an immediately preceding test that has been carried out of the test operations is "pass", no data is changed, and if the result is "fail", data is set in a predetermined signal state, wherein in the method of testing a semiconductor device, plural types of the test operations are carried out, and thereafter, it is judged whether or not the register data is set to a predetermined signal state to judge whether the semiconductor device is normal or defective.

According to a further aspect of the present invention, there is provided a method of testing a semiconductor device integrated on a semiconductor chip, the semiconductor device comprising a memory cell array that comprises nonvolatile memory cells; a first register that stores an address of a defective region in the memory cell array; a plurality of internal voltage generator circuits; and a second register provided corresponding to each of the plurality of internal voltage generator circuits, the second register storing a trimming value for setting an internal voltage value generated by each of the internal voltage generator circuits, the semiconductor device being integrated on a semiconductor chip, the method of testing a semiconductor device, comprising:

resetting the address of the defective region stored in the first register and the trimming value stored in the second register; and setting the address of the defective region stored in the first register and the trimming value stored in the second register to a value according to a property of each of the semiconductor chips, wherein the testing is carried out without turning a power supply off after the power supply has been turned on.

According to a further aspect of the present invention, there is provided a method of testing a semiconductor device integrated on a semiconductor chip, the semiconductor device comprising an internal circuit in which an operation or function is changed based on data stored in a register, the method of testing a semiconductor device, comprises:

a first operation configured to cause the internal circuit to carry out a self-judgment test such that a result indicating either "pass" or "fail" is outputted, and a second operation configured to carry out for the register a control that is different depending on the result of "pass" or "fail" in the self-judgment test, wherein the first operation and second operation are repeated alternately in a predetermined number of times to set for the register data reflecting characteristics of each of the semiconductor chips.

According to a further aspect of the present invention, there is provided a method of testing a semiconductor device, the semiconductor device having an internal circuit in which an output is trimmed in $2^N$ different schemes by a register capable of holding N-bit data (where N denotes a positive integer), the method of testing a semiconductor device comprising:

judging in a first test the output of the internal circuit while the N-bit data is placed in a first state, to determine most significant bit data of the N-bit data;

judging, in a kth test (k=2, 3, . . . N), while data from the most significant bit to a (k−1)th bit is maintained to a value determined in a first to (k−1)th test, the output of the internal circuit with the remaining bit being placed in a predetermined value to determine a kth bit data; and setting data reflecting characteristics of each semiconductor device to the register by the N tests.

According to a further aspect of the present invention, there is provided a method of testing a semiconductor device, the semiconductor device comprising a memory cell array in which programmable and erasable nonvolatile memory cells are arranged in column and row directions of a matrix; a sense amplifier; and a bit line extending in the column direction, configured to transmit data of the memory cell array to the sense amplifier, wherein, the method of testing a semiconductor device, comprises determining whether or not an open-circuit, short-circuit or leak is presented in the bit line and sense amplifier to detect a defective column of the memory cell array, without carrying out writing and erasing operation for the memory cells.

According to a further aspect of the present invention, there is provided a method of detecting and replacing a defective column in a semiconductor device, the semiconductor device comprising a memory cell array having a column region and a row region in which memory cells are arranged in column and row directions of a matrix; a redundancy column region having M redundancy columns for replacement with a defective column in the memory cell array; M registers configured to store column addresses to be replaced with the redundancy columns, each of the M registers including a latch placed to a first or second signal state according to whether or not a corresponding redundancy column can be used; a sense amplifier; a counter that selects the M registers sequentially; and a judgment circuit that makes a judgment on whether or not data of a selected column outputted from the sense amplifier coincides with a predetermined expected value and outputs a "pass" or "fail" signal according to a result of the judgment, wherein, the method of detecting and replacing a defective column in a semiconductor device comprising:

setting a column address and the counter to a starting address, when a defective column in the memory cell array is to be detected;

making, if an output of the judgment circuit is "pass", an increment of the column address, and, if the output of the judgment circuit is "fail" and the latch of the register selected by the counter is placed in the first signal state, storing the column address in the register and thereafter making an increment of the column address and the counter after;

making an increment of the counter until the counter has reached a register whose latch is placed in the first signal state, if the output of the judgment circuit is "fail" and the latch of the register selected by the counter is placed in the second signal state, thereafter, storing the column address in the register, and thereafter, making an increment of the column address and the counter; and carrying out the above operations until the counter has reached an end column address.

BRIEF DESCRIPTION OF THE SEVERAL VIEWS OF THE DRAWING

FIG. 7 is a circuit diagram showing an exemplary specific configuration of a variable resister circuit R shown in FIG. 6;

FIG. 8 is a circuit diagram showing a detailed configuration of a trimming data register 23 shown in FIG. 4;

FIG. 9 is a view showing a relationship between data in the register 23 shown in FIG. 8 and a deviation (ΔTint) of a time TINT;

FIG. 13 is circuit diagram showing a schematic configuration of an internal voltage generator circuit 20 shown in FIG. 1, a trimming data register 21, and a circuit in a control circuit 25 relating to these circuits;

FIG. 14 is a view showing a correlation between data stored in the register 21 in the circuit shown in FIG. 13 and a reference voltage Vref;

DETAILED DESCRIPTION OF THE INVENTION

Hereinafter, preferred embodiments of the present invention will be described with reference to the accompanying drawings.

Figure 1:
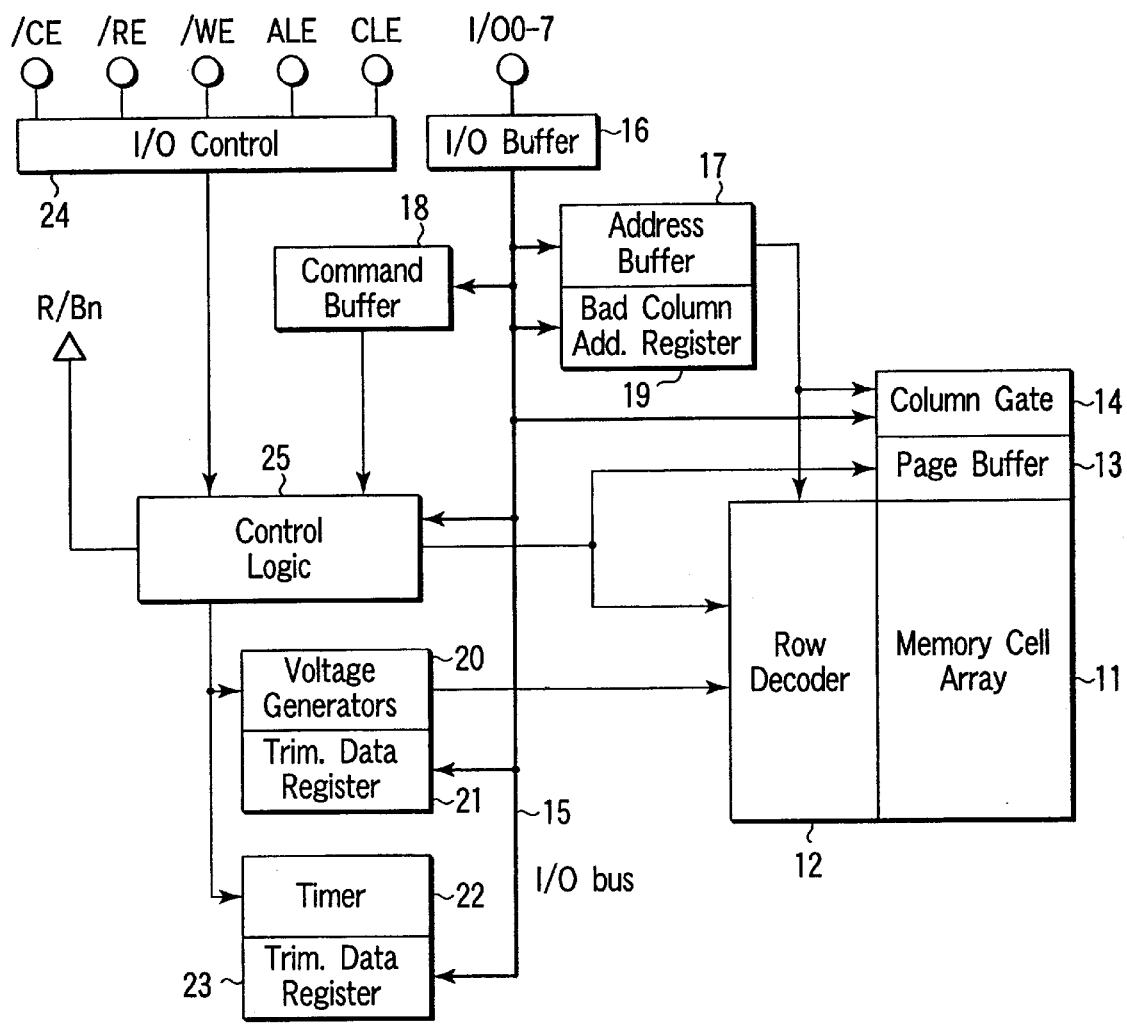
FIG. 1 is a block diagram showing a schematic configuration of a NAND type flash memory according to the present invention.
Figure 2:
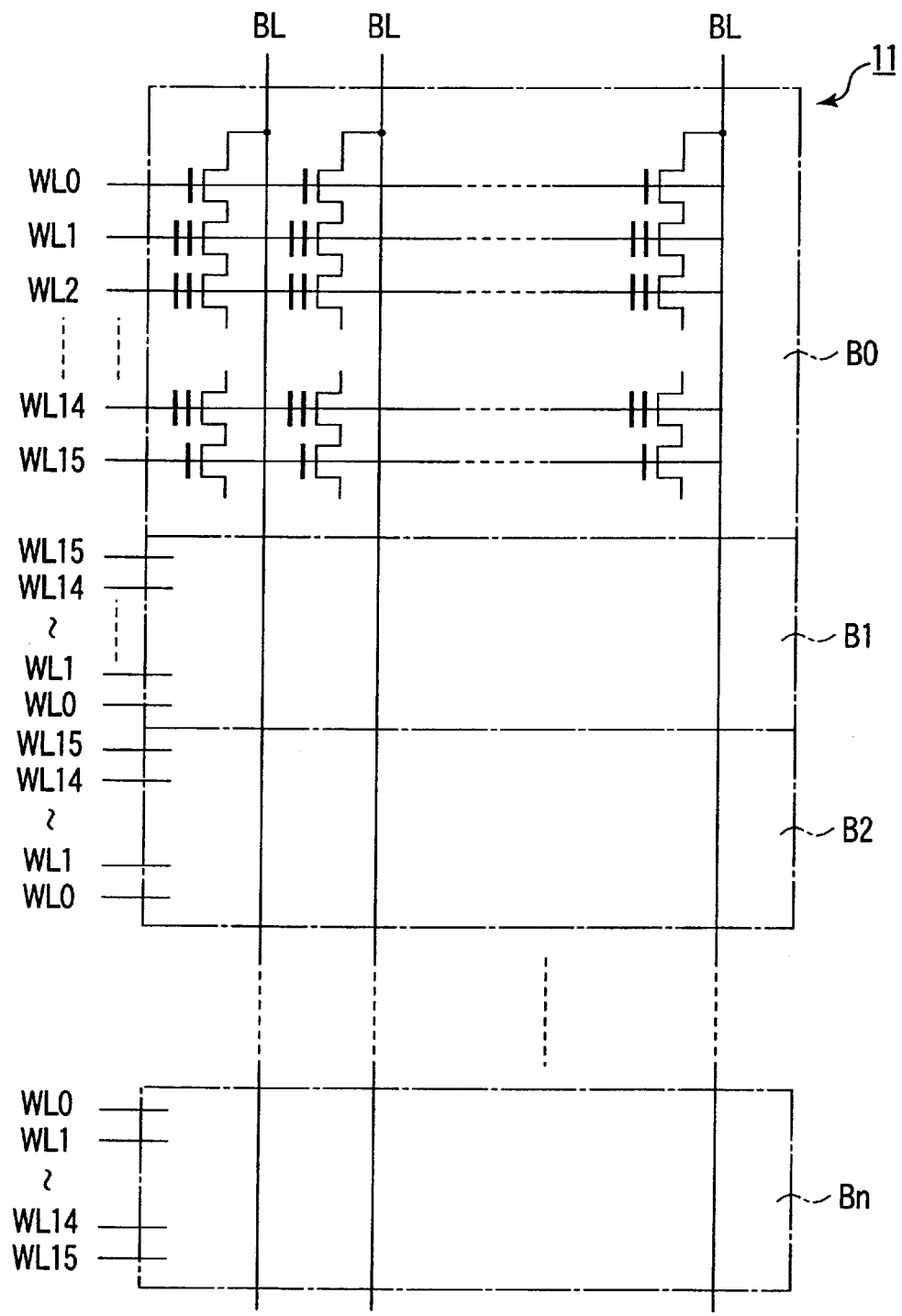
FIG. 2 is a circuit diagram showing a configuration of a part of a memory cell array of the memory shown in FIG. 1.
Figure 3:
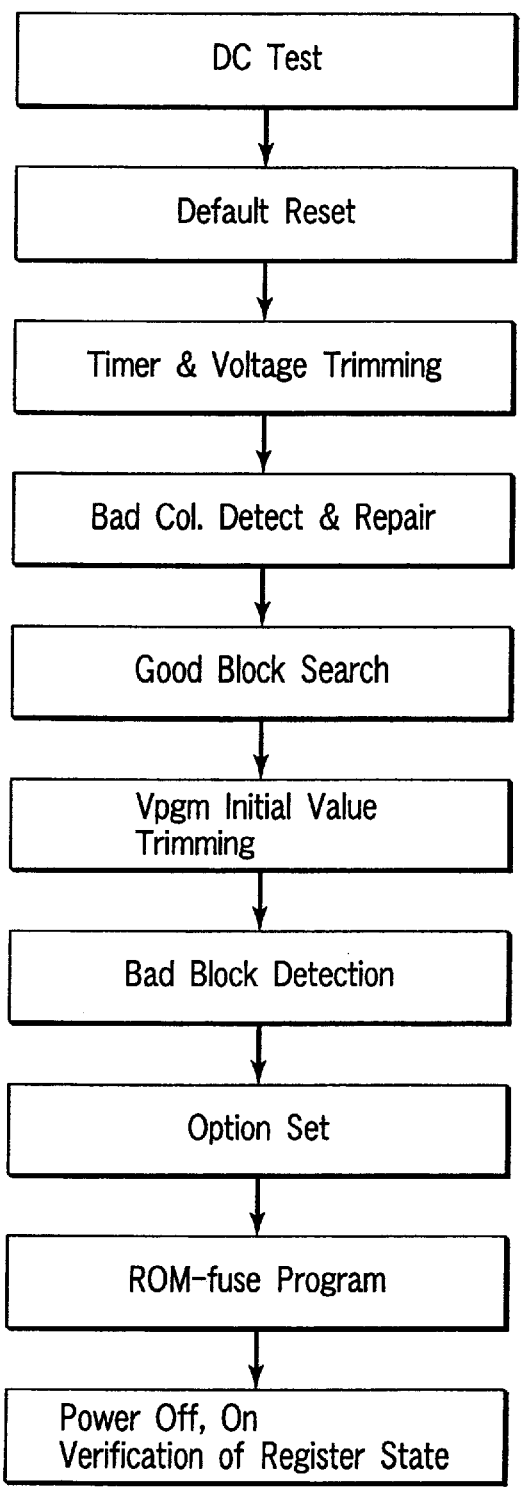
FIG. 3 is a flowchart showing a wafer test step of the memory shown in FIG. 1.

FIG. 1 is a block diagram showing a schematic configuration of a NAND type flash memory formed on a semiconductor chip according to the present invention. FIG. 2 is a circuit diagram showing a configuration of part of a memory cell array in the memory shown in FIG. 1. FIG. 3 is a flowchart showing a wafer test step in the memory shown in FIG. 1.

In FIG. 1, a memory cell array 11 is configured so that a nonvolatile memory cell (not shown) capable of being electrically rewritten is arranged in column and row directions in matrix. The above nonvolatile memory cells each have a stack gate type MOS transistor structure having a control gate and a floating gate laminated thereon.

Here, the memory cell array 11 is formed a well region insulated/separated from another region. When memory cell data in the memory cell array 11 is erased, there is employed an erasing method such that erasure operation is divided into a plurality of steps, thereby to be associated with a step sequence, and an erasure voltage assigned in the above well region is increased from an initial voltage by a predetermined voltage.

In addition, a redundancy column replaced with a defective cell for use is provided in the memory cell 11. Further, an initialization data region for storing initialization data is set in the memory cell array 11.

In the memory cell array 11, a plurality of word lines WL and a plurality of bit lines BL are provided so as to cross each other, and a plurality of word lines are selectively driven by a decode output of a row decoder 12. During data readout, the data read out from the memory cell in the memory cell array 11 is supplied to a page buffer 13 via the bit line BL, and is sensed here. The data sensed by the page buffer 13 is selected in units of columns by a column gate circuit 14 to be supplied to an I/O bus 15, and further, is outputted from an I/O buffer 16 to the outside of a semiconductor chip. During data writing, in contrary to the above, the write data supplied from the outside of the semiconductor chip is supplied to the column gate circuit 14 via the I/O buffer 16 and the I/O bus 15. In this manner, a voltage according to write data is supplied to the bit line BL via the page buffer 13, and data is written into a selected memory cell.

In addition, to the above I/O buffer 16, the above write data is supplied from the outside of the chip during data writing, and a command for controlling an address for selecting a memory cell or memory operation is supplied. An address is captured in an address buffer 17, and a command is captured in a command buffer 18. A row address of the addresses captured in the access buffer 17 is supplied to the row decoder 12, and a column address is supplied to the column gate circuit 14.

In the case where a defective column exists in the above memory cell 11, a defective column address register (Bad Column Add. Register) 19 for storing an address corresponding to such a defective column or a defective column address is provided. That is, the defective column address register 19 is a register that stores an address of a defective column to be replaced with a spare column (that is, to be redundancy replaced). In a memory according to the present embodiment, a defective block is detected, and a flag is set so that a defective block/address can be identified by a user. Faulty block flag information is stored in a latch in the row decoder 12. This defective column address register 19 is connected to the above I/O bus 15.

An interval voltage generator circuit 20 generates a variety of voltages for use in chips. This voltages include Vref (reference voltage), Vpgm (writing voltage), an internal fall voltage (Vdd), an erasure voltage (Verase), a non-selected cell word line voltage (Vread) supplied to a non-selected cell word line and the like. A variety of voltages generated by the internal voltage generator circuit 20 is supplied to the row decoder 12 or the like.

A trimming data register (Trim. Data Register) 21 stores adjustment data (trimming data) for used in chips.

A timer circuit 22 generates a variety of timing pulses used when a variety of voltages are generated.

A trimming data register (Trim. Data Register) 23 stores adjustment data (trimming data) used when a variety of the above timing pulse is generated by the above timer circuit 22. In the above trimming data registers 21 and 23, when power is turned ON, data to be stored in a register are read out from an initialization data region described later in the memory cell array 11, and the read data are stored sequentially in the registers 21 and 23 each via the I/O bus 15.

An I/O control circuit (I/O Control) 24 captures a variety of control signals such as a chip enable signal /CE supplied from the outside of a chip, a read enable signal /RE, a write enable signal /WE and the like. The control signal captured by the I/O control circuit 24 and the command captured by the above command buffer 18 are supplied to a control circuit (Control Logic) 25.

The above control circuit 25 controls an operation of each of the circuits inside the chips based on the result obtained by decoding the control signal and command from the I/O control circuit 24. A variety of registers for storing control data are provided in this control circuit 25. In addition, the control circuit 25 has a function for outputting a ready/busy (R/Bn) indicating whether or not a chip is accessible to an external circuit.

In the memory array 11 shown in FIG. 2, for example, 16 memory cells are connected in series, thereby configuring a NAND cell unit. A plurality of NAND cell units to which the work lines WL (WL0 to WL15) are connected in common configures a cell block that is a minimum unit of data erasure, and a plurality of cell blocks B0, B1, . . . , Bn are disposed with the bit line BL being in common.

In the memory cell array 11, for example, the cell block Bn is used as an initialization data region for storing an initialization data. This initialization data region enables data writing, erasure, and readout by selectively driving the bit line BL and the word line WL. However, this region cannot be accessed from the outside in normal memory operation. Therefore, the data in this initialization data region is not erased during back data erasure or block unit erasure.

Now, an operation of each step during wafer test for a memory having the above configuration will be described with reference to a flowchart shown in FIG. 3.

The wafer test comprises the following steps.

(1) DC test (DC Test)
(2) Default reset (Default Reset)
(3) Timer and voltage trimming (Timer & Voltage Trimming)
(4) Faulty column detection and replacement (Bad. Co. Detection & Repair)
(5) Searching a normal memory block (Good Block Search)
(6) Vpgm initial value trimming (Vpgm Initial Value Trimming)
(7) Faulty memory block detection (Bad Block Detection)
(8) Option set (Option Set)
(9) ROM fuse program (ROM-Fuse Program)
(10) Verification of register state when power is turned ON/OFF (Power Off, On Verification of Register State)

Of such wafer tests, the steps from (2) default reset to (9) ROM fuse program are continuously carried out without turning OFF the power after the power has been turned ON.

Now, a description of each item will be given below.

(1) DC Test

First, DC test is carried out in the same way as in the prior art. Although this test cannot be carried out as automatic test, a rate of the test time to a total of test time is small, and thus, the test time is not affected.

(2) Default Reset

All registers are set to default (initial) state after DC test. Although this test cannot be carried out as an automatic test, the trimming data registers 21 and 23 are reset so that the storage value of each register is obtained as a default trimming value. On the other hand, the defective column address register 19 and the defective block flag is reset so that a defective column and a defective block do not exist.

(3) Timer and Voltage Trimming

This step carries out trimming of a pulse width of a pulse signal generated by the timer circuit 22 and trimming of a value of a voltage generated by the internal voltage generator circuit 20. The voltages to be trimmed here include: a reference voltage Vref, an internal fall voltage Vdd, and a non-selected cell work line voltage Vread.

Hereinafter, the testing methods are described for each item.

Timer Trimming

Figure 4:
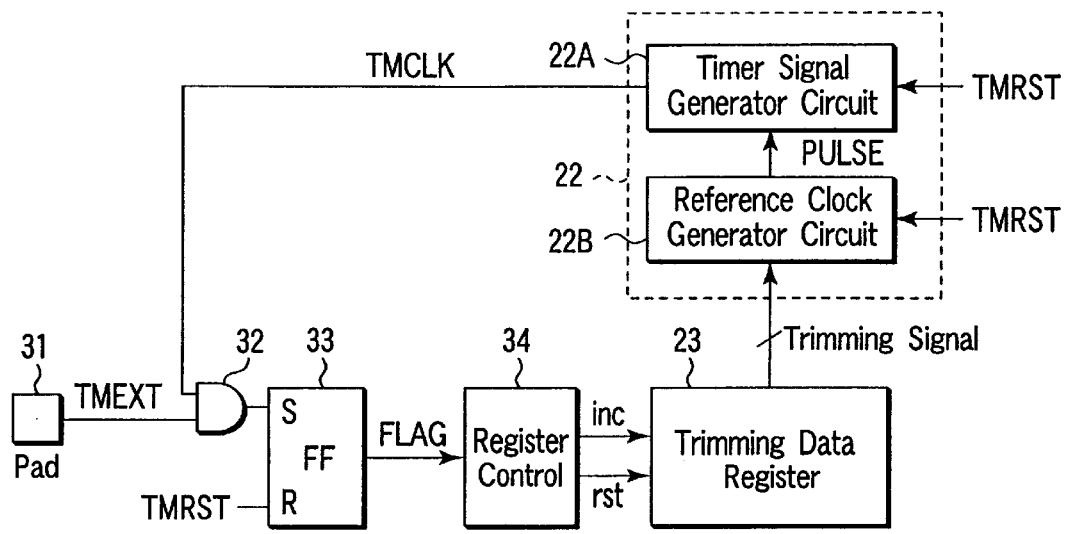
FIG. 4 is a circuit diagram showing a specific configuration of a timer circuit 22 shown in FIG. 1, a trimming data register 23, and a circuit in a control circuit 25 relating to these circuits.

FIG. 4 shows a specific configuration of a circuit in a timer circuit 22 shown in FIG. 1, a trimming data register 23, and a control circuit 25 relating to these circuits.

The timer circuit 22 is composed of a timer signal generator circuit 22A and a reference clock generator circuit 22B.

Figure 5:
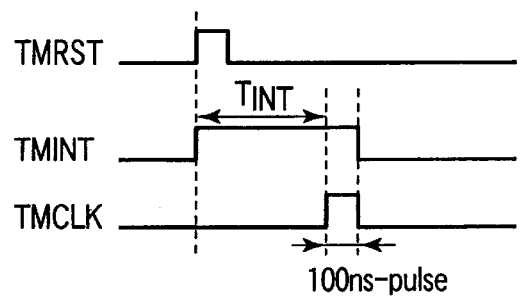
FIG. 5 is a timing chart showing an example of operation of the circuit shown in FIG. 4.

The timer signal generator circuit 22A generates a pulse TMCLK from a basic clock PULSE generated by the reference clock generator circuit 22B, as shown in a timing chart of FIG. 5. Here, the above pulse TNINT is a pulse that corresponds to an integer product of the basic clock, and that is generated with a timer reset signal TMRST being a trigger. The pulse TMCLK is set to "H" after an elapse of time of TINT after the pulse TMINT has been set to "H". The pulse width (100 ms) of the time TINT and the pulse TMCLK is generated from the reference clock, and thus, increases or decreases according to a deviation of the reference clock.

The pulse TMCLK generated by the timer signal generator circuit 22A is supplied to an AND gate 32 together with to a pulse TMEST having a desired pulse width Text, the pulse TMEST being supplied to a chip pad (Pad) 31.

An output of the above AND gate 32 is supplied to a set terminal of a flip flop 33 of set/reset type. In addition, a timer reset signal TMRST is supplied to a reset terminal of the flip flop 33. An output of this flip flop 33 is supplied as a flag FLAG to a trimming data register control circuit (Register Control) 34. This control circuit 34 supplies an increment signal "inc" or a reset signal "rst" to the trimming data register 23 according to a state of the above flag FRAG.

Figure 6:
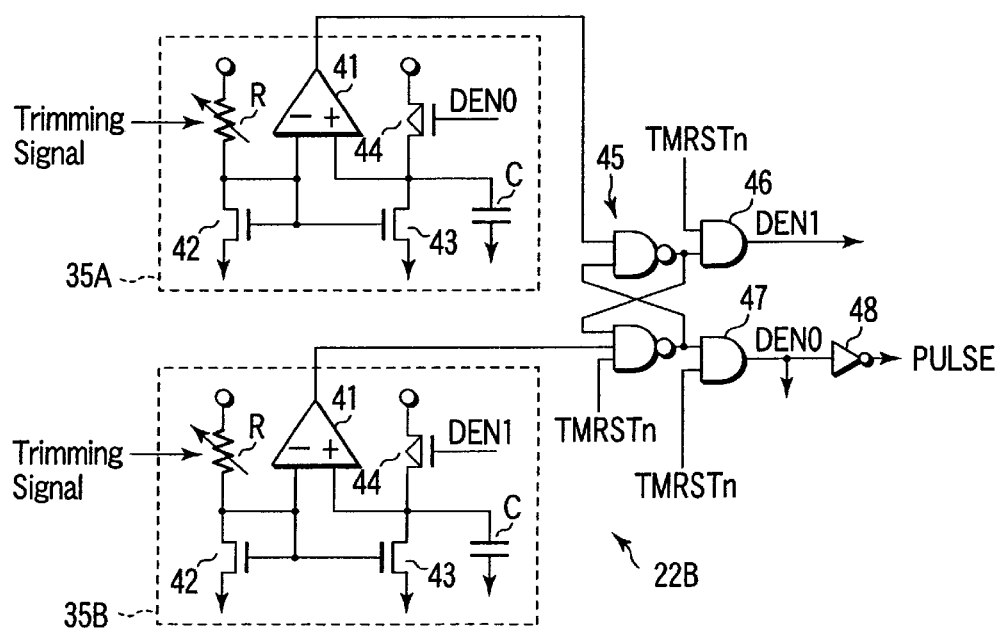
FIG. 6 is a circuit diagram showing a specific example of a reference clock generator circuit 22B shown in FIG. 4.

A specific example of the above reference clock generator circuit 22B is shown in a circuit diagram of FIG. 6. Here, two reference delay generator circuits 35A and 35B has a similar circuit configuration. These two circuits each are composed of: a differential amplifier 41; two N-channel MOS transistors 42, 43; a variable register circuit R that changes a resistance value between both terminals according to a trimming signal; a P-channel MOS transistor 44 and a capacitor C. Reference delay generator circuits 35A and 35B each generate a delay time that corresponds to a product RC between a resistance value in the variable resistor circuit R and a capacitance value of the capacitor C.

Outputs of both of the above reference delay generator circuits 35A and 35B are supplied to a flip flop 45 that comprises two NAND circuits together with a timer reset signal TMRRSTn. In one output signal of this flip flop 45, an AND logic with the timer reset signal TMRRSTn is obtained by an AND circuit 46, whereby a control signal DEN1 is generated. This control signal DEN1 is supplied to a gate of the P-channel MOS transistor 44 in one reference delay generator circuit 35B. In addition, in the other output signal of the above flip flop 45, an AND logic with the timer reset signal TMRRSTn is obtained by an AND circuit 47, whereby a control signal DEN0 is generated. This control signal DEN0 is supplied to a gate of the P-channel MOS transistor 44 in the other reference delay generator circuit 35A, and is inverted by an inverter 48 to be obtained as a basic clock PULSE.

In the thus configured reference clock generator circuit 22B, in the reference delay generator circuits 35A and 35B, the P-channel MOS transistor 44 is turned ON while the control signal DEN0 or DEN1 is set to "L", and the capacitor C is charged by a power voltage. Here, when a threshold voltage of the N-channel MOS transistor 42 is defined as Vth, a voltage of a negative terminal of the differential amplifier 41 is set to Vth.

Next, when the control signal DEN0 or DEN1 is changed to "H", the P-channel MOS transistor 44 is turned OFF, and charging of the capacitor C is not carried out. Here, the N-channel MOS transistors 42 and 43 each configure a current mirror circuit. A current proportional to a current that flows the N-channel MOS transistor 42 via the variable register circuit R flows the N-channel MOS transistor 43 as well, and the capacitor C is discharged by this current. Then, if the terminal voltage of the capacitor C is lower than the voltage Vth of the negative terminal of the differential amplifier 41, an output signal of the differential amplifier 41 is inverted from "H" to "L". Then, a delay time from when the control signal DEN0 or DEN1 is inverted from "L" to "H", then to when the output of the differential amplifier 41 is inverted from "H" to "L" corresponds to the above product RC between the resistance value in the variable resistor circuit R and the capacitance value of the capacitor C. Such operation is repeated alternately by the two reference delay generator circuits 35A and 35B, whereby a basic clock PULSE having a period that is twice of the delay time RC is outputted from the inverter 48. Here, the variable register circuit R can change a resistance value according to a value of a trimming signal, thus making it possible to adjust a reference delay time by means of a trimming signal. The reference clock generator circuit 22B is not limited to that shown in FIG. 6. Any other circuit configuration may be used as long as a reference clock can be adjusted by a trimming signal.

FIG. 7 is a circuit diagram showing a specific, exemplary configuration of the variable resistor circuit R shown in FIG. 6. This variable resistor circuit R is composed of a decoder circuit 49; eight resisters R0 to R7 whose values are different from each other; and eight N-channel MOS transistors Q, each of which are connected in series to each of these registers.

The above decoder circuit 49 decodes a 3-bit trimming signal TTMR0 to TTMR2, for example, and eight different decode signals are outputted. Then, each of these eight different decode signals is supplied to a gate of each of these eight N-channel MOS transistors Q.

In the thus configured variable resistor circuit R, any one of the eight N-channel MOS transistors Q is turned ON based on the 3-bit trimming signals TTMR0 to TTMR2, whereby the resistance value between both terminals (between both terminals of a serial circuit between each of the resistors R0 to R7 and each of the eight N-channel MOS transistors Q) changes in eight different ways.

FIG. 8 shows a detailed circuit configuration of the trimming data register 23 shown in FIG. 4. This register 23 holds 4-bit data, for example. This index bit serves as an index indicating whether or not trimming test has been carried out. Remaining 3 bits TTMR0 to TTMR2 are net trimming information.

As shown in FIG. 8, the counter configured of three D-type flip flops (DFF) 550 that have been connected in series is compatible with a register that stores trimming information TTMR0 to TTMR2. The index bit is stored in a latch circuit (INDEX Latch) 51. The data contained in each flip flop 50 and latch circuit 51 is inputted/outputted between the I/O bus 15 via each of two clocked inverters 52 and 52 provided for each flip flop 50 and latch circuit 51, respectively.

When the data contained in the register 23 is written into a memory cell, the data is transferred to a page buffer 13 (shown in FIG. 1) via the I/O bus 15. In addition, when the data is transferred from the memory cell to the register 23 after power has been turned ON, the data is captured from the page buffer 13 to the register 23 via the I/O bus 15.

FIG. 9 shows a relationship in deviation ($\Delta$ TINT) between the data (TTMR0 to TTMR2 and INDEX) contained in the register 23 and the above TINT. The INDEX bit is set to "0" in a default reset state, and is set such that a deviation between each of TTMR0 to TTMR2 and TINT is obtained as 0%. When timer trimming test is started, the register data is set to its initial state. At this time, the INDEX bit is set to "1". In the initial state, TTMR0 to TTMR2 are set to all "0"s.

Next, every time the increment signal "inc" is generated from the control circuit 34 shown in FIG. 4, the data contained in TTMR0 to TTMR2 are sequentially incremented. As shown in FIG. 9, the TINT time is controlled to be sequentially increased as TTMR0 to TTMR2 are incremented.

Trimming of the timer circuit can be done as follows by using such register function and circuit configuration.

Figure 10:
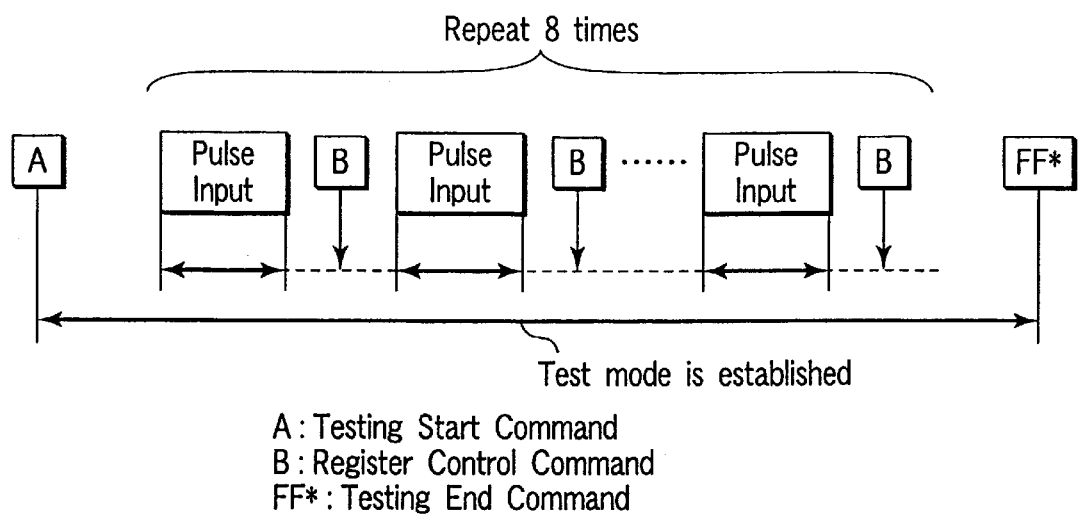
FIG. 10 is a view showing a sequence during trimming of the timer circuit 22 shown in FIG. 4.
Figure 11A:
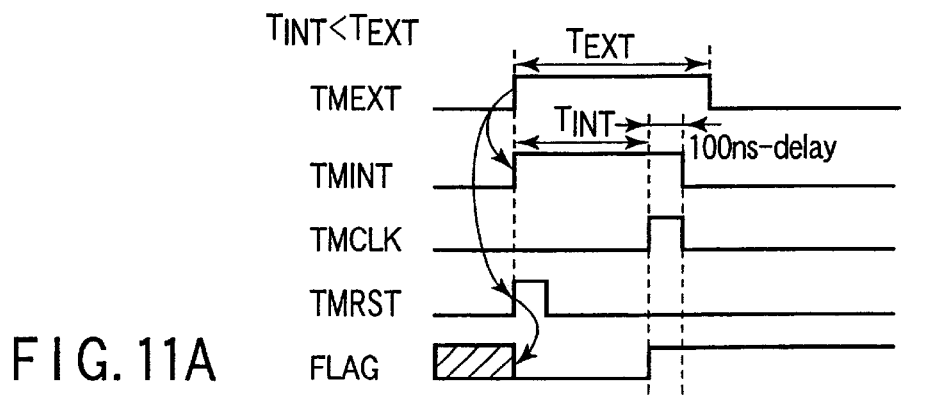
FIGS. 11A and 11B are views showing timing charts during trimming of the timer circuit 22 shown in FIG. 4.
Figure 11B:
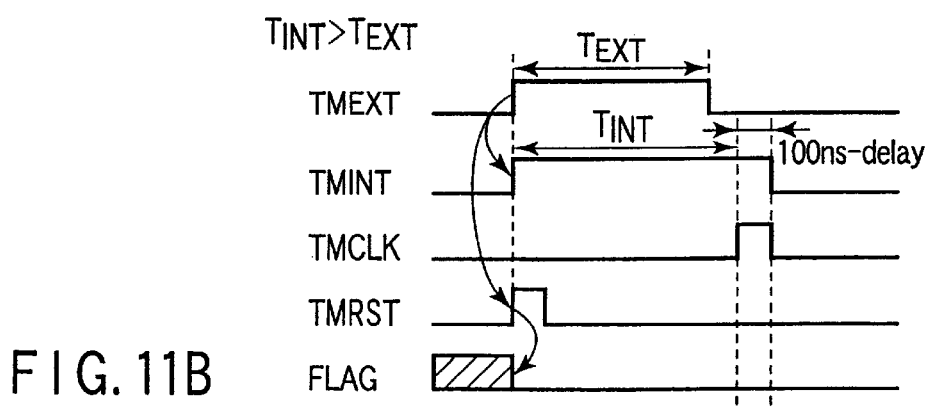
Figure 12:
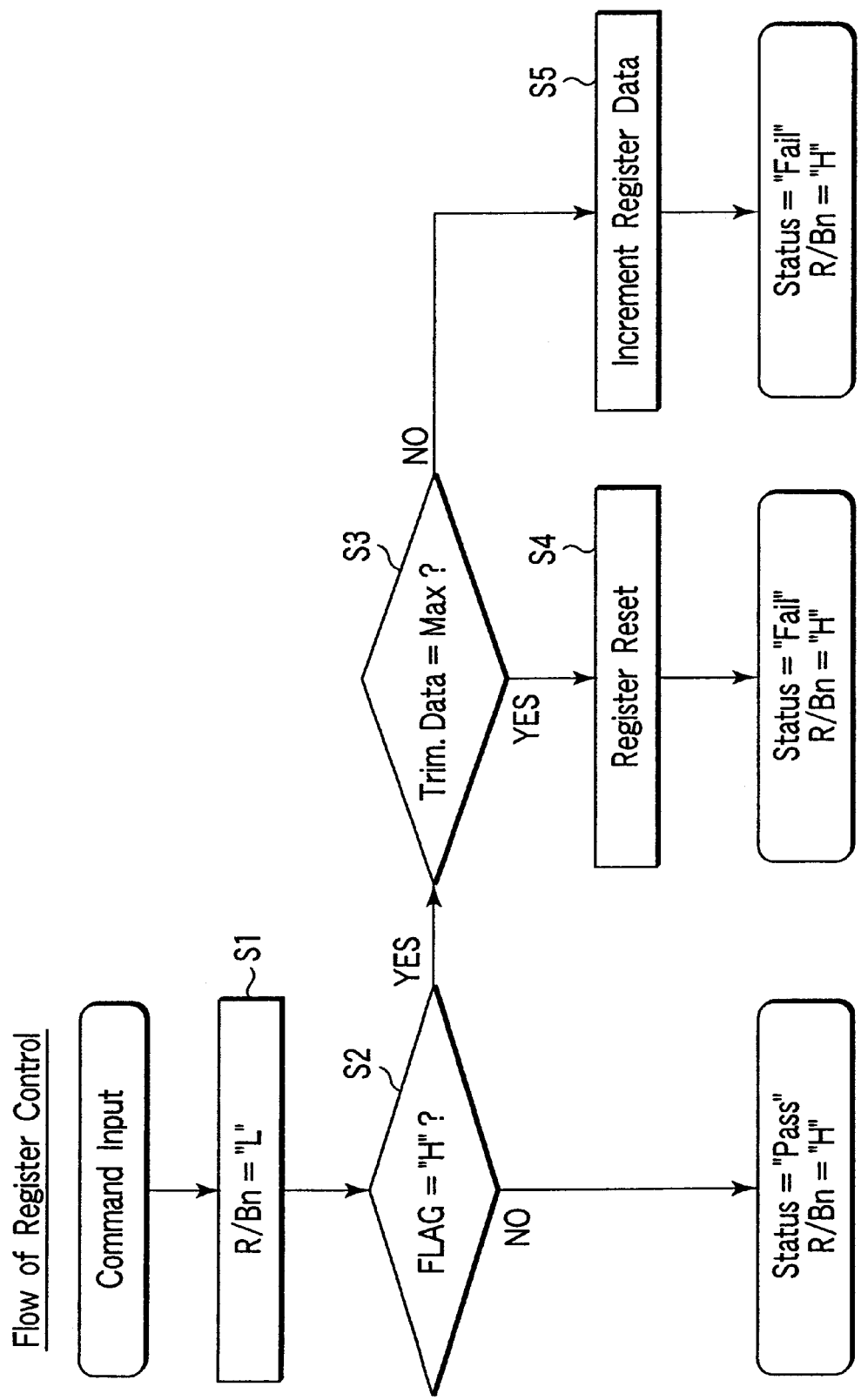
FIG. 12 is a flowchart showing operating procedures when a register control command is supplied to an I/O buffer 16 shown in FIG. 1.

FIG. 10 shows a sequence during trimming of the timer circuit 22. FIGS. 11A and 11B show timing charts during trimming. FIG. 12 is a flowchart showing operating procedures when a register control command is supplied to an I/O buffer 16 shown in FIG. 1. First, when a testing start command is inputted, the register 23 is set to its initial state so that the timer circuit 22 can be tested.

Next, a pulse TMEXT having a target width Text is inputted to a pad 31 shown in FIG. 4. In this manner, pulses TMRST, TMINT, and TMCLK are set with TMEXT being a trigger. Here, as shown in FIG. 11A, when the pulse TMCLK is set while TMEXT is set to "H", FLAG becomes "H". As shown in FIG. 11B, when the pulse TMCLK is set while TMEXT is set to "L", the flag FLAG becomes "L".

Next, a register control command is inputted. When this command is inputted, when FLAG is set to "H", the control circuit 34 generates an increment signal "inc". If FLAG is set to "L", the increment signal "inc" is not generated. The register control command may be formed as general command input or a /WE signal toggle.

When testing is carried out in accordance with the sequence shown in FIG. 10, while Tint<Test, the register data are sequentially incremented, and the timer times sequentially increases. At a stage when Tint>Text, the data are not incremented. Therefore, at a time when a testing end command is supplied, and the sequence terminates, the register data is set to a value such that Tint and Text are substantially equal to each other.

Although a target value of a basic clock pulse width is 100 ms, the TINT time is set to 100 microseconds, for example, which is sufficiently longer than the target value. This is because an effect caused by a logic delay occupied in TINT is sufficiently reduced.

Now, a flowchart shown in FIG. 12 will be briefly described.

When a test command is supplied (command input), an R/Bn (ready/busy) signal is set to "L" at the step S1 (R/Bn="L"), and it is notified to the outside that the chip is in a busy state. Next, at the step S2, it is judged whether or not the flag FLAG is set to "H" (FLAG="H"?). At this time, when the flag FLAG is not set to "H", the pulse width of the basic clock has already been to set to a target value. Then, a status (Status) is set to a pass (Pass) state (Status="Pass"), the R/Bn signal is set to "H", and timer trimming test operation terminates.

On the other hand, when it is judged that the flag FLAG is set to "H" at the step S2, it is judged whether or not trimming data reaches a maximum at the next step S3 (Trim. Data=Max?). When the data has already reached the maximum, the register 23 is reset at the step S4 (Register Reset). Then, a status is set to a fail (Fail) state (Status= "Fail") that indicates that trimming has failed, the R/Bn signal is set to "H", and timer trimming test operation terminates.

When it is judged that the trimming data does not reach the maximum at the step S3, data contained in the register 23 is incremented at the next step S5 (Increment Register Data). Then, a status is set to a fail state (Status="Fail"), the R/Bn signal is set to "H".

The above described testing method has the following advantages.

(1) A tester may only input a common command to each chip. In particular, it is required to carry out computation for determining trimming data by using the tester's CPU.

(2) In addition, the tester may not have a memory for storing characteristic data for each chip These facts denotes that testing can be carried out completely in parallel to about 100 chips. In addition, they means that trimming test can be done even by using a tester with high performance or high capability. Therefore, as compared with a conventional testing method, a test time can be significantly reduced, and a testing cost can be significantly reduced.

Here, a trimming test of the timer circuit 22 has been described. As described hereinafter, the essence of this test is applicable to voltage trimming or redundancy computation as well.

In addition, although this system assumes a memory capable of writing trimming data into the memory cell array 11, the system is applicable to a memory having trimming data stored in a laser fuse as well. In that case, after trimming data has been determined with the above described method, the data contained in the registers 21 and 31 are moved to the tester memory, and then, fuse cutting may be carried out based on the data. In this case, although the above advantage of (2) is lost, the above advantage of (1) is maintained, thus making it possible to reduce a test time.

Voltage Trimming

Voltages for use in chips each can be carried out in the same way as when trimming of the above timer circuit 22 is carried out.

FIG. 13 shows a specific configuration of an internal voltage generator circuit 20 shown in FIG. 1, a trimming data register 21, and a circuit in a control circuit 25 relating to these circuits. Now, a description will be given by way of example of generating a reference voltage Vref.

The internal voltage generator circuit 20 is composed of: a divider circuit supplied to a pad 61 (Monitor PAD) from the output of the reference voltage Vref or chip generated by this internal voltage generator circuit 20, the divider circuit consisting of a variable resistor circuit 62 and a resistor 63 connected, the divider circuit resistance-dividing a reference voltage that corresponds to a desired reference voltage; a comparator 65 that compares a BGR voltage Vgr generated by a band gap type constant voltage generator circuit (BGR Circuit) 64 with a voltage divided by the divider circuit that comprises the above variable resistor circuit 62 and resistor 63; a flag generator circuit 66 that generates the flag FLAG based on an output of this comparator 65 and a test signal VREFTEST; a switch circuit 67 that comprises two P-channel MOS transistors connected in series in order to connect a node of the reference voltage Vref to a power voltage based on the output of the comparator 65 and the test signal VREFTEST; and a register control circuit (control) 68 that supplies an increment signal "inc" or a reset signal "rst" to the register 21 based on the above flag FLAG.

Here, the trimming signal outputted from the register 21 is obtained as 4 bits of TVREF0 to TVREF3, for example. A configuration of this register 21 may be similar to that of timer trimming. In the variable resistor circuit 62, a resistance at both ends of the circuit changes according to the above 4-bit trimming signals TVREF0 to TVREF3. This variable resistor circuit 62 may be configured in the same way as that shown in FIG. 7. However, in this case, a decoder circuit corresponding to the decoder circuit 49 outputs 16 different decode signals according to a 4-bit trimming signal. 16 resistors corresponding to the resistors R0 to R7 are provided, and 16 MOS transistors corresponding to the N-channel MOS transistors Q as well are provided.

FIG. 14 shows a correlation between data stored in the register 21 and a reference voltage Vref in the circuit shown in FIG. 13. Further, FIG. 15 shows a test sequence of the circuit of FIG. 13.

Figure 15:
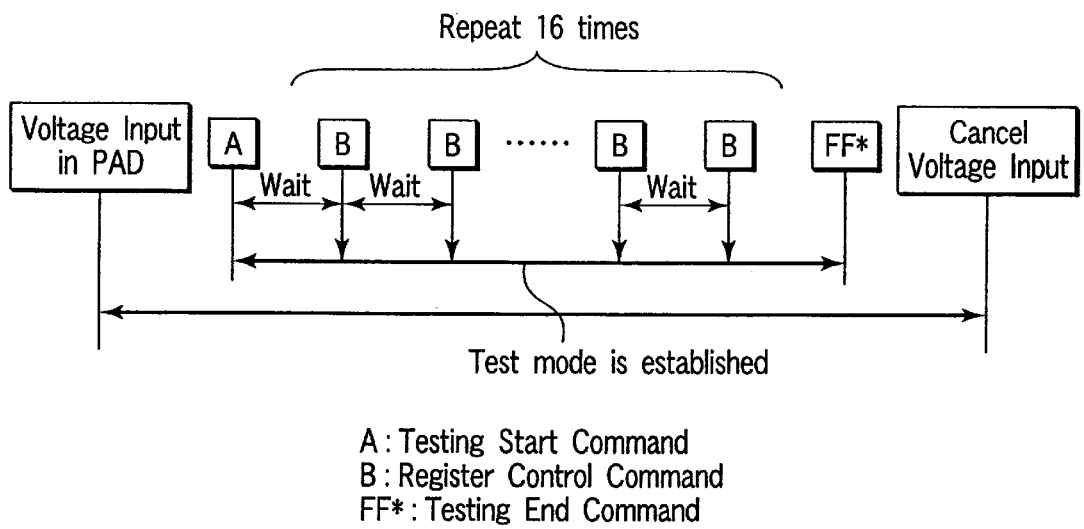
FIG. 15 is a view showing a test sequence of the circuit shown in FIG. 13.

As shown in FIG. 15, when trimming of the reference voltage Vref is carried out, a reference voltage is first inputted to a pad 61. Subsequently, when a testing start command is inputted, the test signal VREFTEST shown in FIG. 13 is set to "H", and the switch circuit 67 is turned OFF. Then, the reference voltage inputted to the pad 61 is divided by the divider circuit that comprises the variable resistor circuit 62 and resistor 63, and the divided voltage is compared with the BGR voltage Vbgr generated in the chip by the comparator 65. In addition, when the test signal VREFTEST is set to "H", the flag generator circuit 66 is operable, and the comparison result of the comparator 65 is reflected on the flag FLAG.

Here, the register data and output voltage (Vref) have a relationship as shown in FIG. 14. While the output voltage Vref is smaller than its target value, the register data is incremented (inc) every time a register control command (B in FIG. 15) is inputted. Then, at a time when the output voltage Vref is greater than the target value, incrementing stops. In this way, as in timer trimming, voltage trimming can be done by a complete parallel test.

Trimming of the internal fall voltage Vdd as well can be done with the circuit and method similar to that of the reference voltage Vref.

As shown in FIG. 15, instead of inputting a register control command B from the outside, a register control operation may be carried out automatically by using the timer circuit 22 and control circuit inside the chips.

Figure 16:
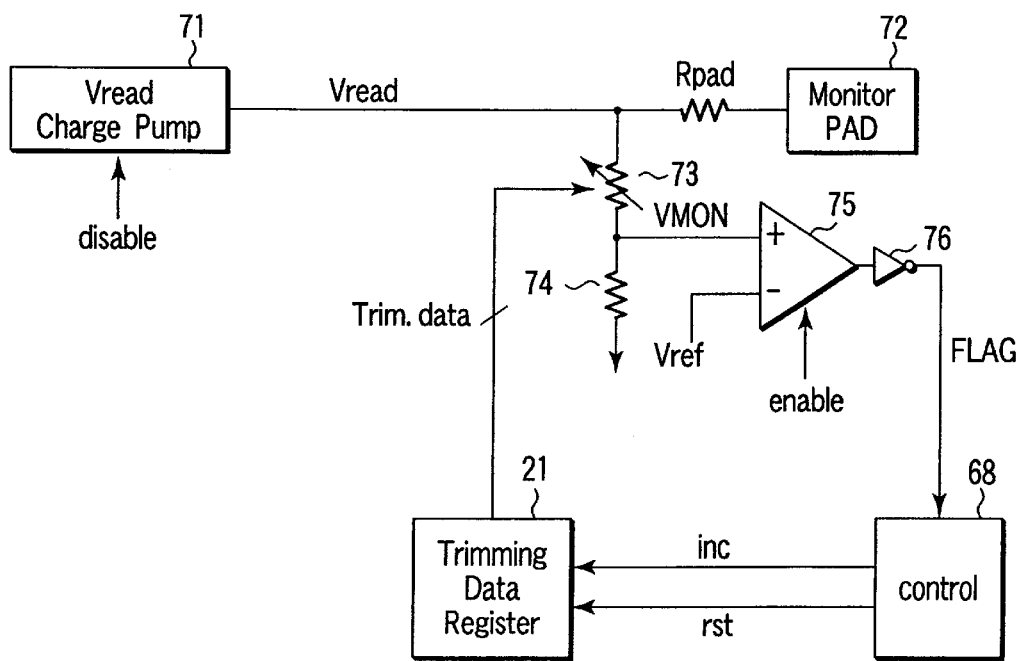
FIG. 16 is a circuit diagram showing a circuit at a portion relating to generation of a non-selective cell word line voltage Vread of the internal voltage generator circuit 20 shown in FIG. 1 and a circuit in a control circuit 25 relating to these circuits.

On the other hand, in the case of trimming a rise voltage such as non-selected cell word line voltage Vread, the circuit having the configuration as shown in FIG. 16 is used. That is, FIG. 16 shows a circuit at a portion relating to generation of a non-selected cell word line voltage Vread of the internal voltage generator circuit 20 shown in FIG. 1 together with a trimming data register 21 and a circuit in the control circuit 25 relating to these circuits.

A non-selected cell work Vread is generated by a voltage rise circuit (Vread Charge Pump) 71. The voltage Vread generated by this voltage rise circuit 71 and the reference voltage supplied from the outside of the chip, the reference voltage corresponding to a desired non-selected cell word line voltage, are resistance-divided by a divider circuit that comprises a variable register circuit 73 and a resistor 74 that are connected in series. The above divided voltage VMON is compared with the reference voltage Vref by a comparator 75. An output of this comparator 75 is inverted by an inverter 76, and the inverted output is supplied as a flag FLAG to a register control circuit 68. This register control circuit 68 supplies an increment signal "inc" or a reset signal "rst" to the register 21 based on the above flag FLAG.

When a testing start command is inputted while a reference voltage is inputted to a pad 72, a voltage rise circuit 71 is placed in an inactive state based on a disable signal "disable", and further, the comparator 75 is placed in an active state based on an enable signal "enable". Then, the reference voltage inputted to the pad 72 is resistance-divided by means of a divider circuit that comprises the variable resistor circuit 73 and resistor 74, and the divided voltage is compared with the reference voltage Vref by the comparator 75. The increment signal "inc" or reset signal "rst" are supplied from the register control circuit 68 to the register 21 according to the flag FLAG generated based on the comparison result.

As shown in FIG. 16, a parasitic resistance Rpad associated with wiring exists between the pad 72 and the variable resistor circuit 73. When this parasitic resistance Rpad is great, even if a correct reference voltage is inputted to the pad 72, the voltage after trimming is shifted. In such a case, a higher reference voltage may be inputted in advance to the pad 72 so that a value of Rpad is nor affected by such shifting. This input is effective in reference voltage inputted from the corresponding pad during trimming of the reference voltage Vref and internal fall voltage vdd.

Figure 17:
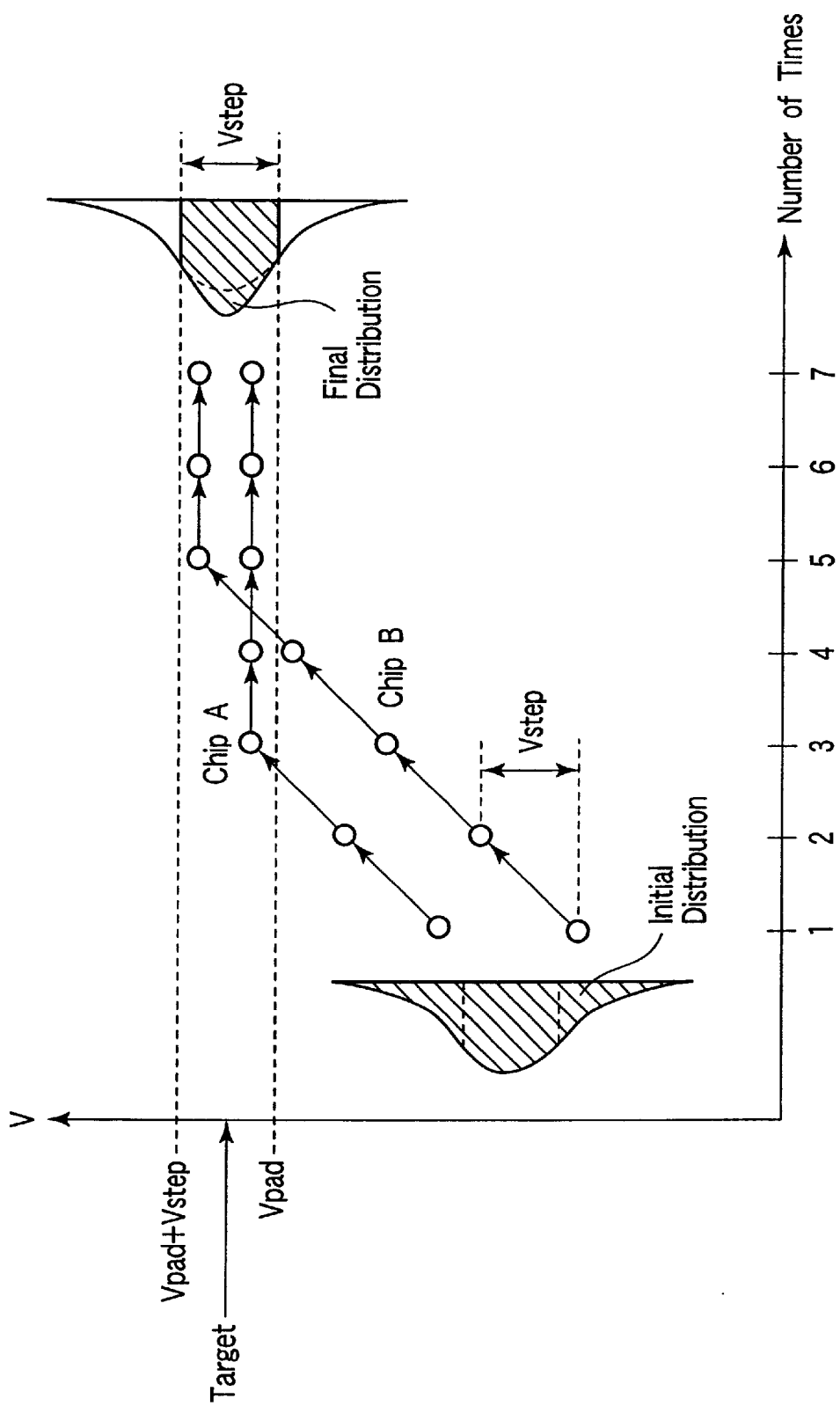
FIG. 17 is a view showing a relationship between the trimming count when trimming of each voltage is carried out and a voltage after trimming.

FIG. 17 shows a relationship between trimming count and voltage after trimming when trimming of each voltage is carried out as described above. In the case where trimming of each voltage is carried out, a predetermined dispersion occurs at the initial voltage of each chip, as shown in FIG. 17, depending on conditions such as manufacturing process (Initial Distributing). For example, if the initial voltage of a chip A is higher than that of a chip B, a dispersion of stepping voltage Vstep per step occurs between the chips A and B at a time when trimming terminates (Final Distributing).

Then, a voltage lower than a target value by Vstep/2, namely, a voltage obtained by target value−Vstep/2 is inputted as a reference voltage inputted to the pad during trimming, the voltage after trimming just coincides with a target value, and a dispersion does not occur between chips. Conversely, the target value may be a voltage higher than a reference voltage Vpad inputted to the pad by Vstep/2 may be, namely, Vpad+Vstep/2.

(4) Faulty Column Detection and Replacement

Conventionally, defective column detection has been carried out after a memory block (Good Block) has been detected, and trimming of the Vpgm initial value has been carried out.

However, there may occur a circumstance that, if a defective column exists, a normal memory block does not exist in a semiconductor chip. This is because, although whether or not a normal memory block exists is judged according to whether or not writing/erasure is carried out, and thereafter batch sensing is passed for check, if a defective column exists, the result is always "fail" (Fail) during batch sensing.

Because of this, in a memory according to the present embodiment, normal memory block search (Good Block Search) is carried out after defective column detection and replacement of a detected defective column with a redundancy column, and trimming of the Vpgm initial value is carried out.

In order to carry out defective column detection and replacement with a redundancy column prior to carrying out trimming of the Vpgm initial value, it is required to detect a defective column by making a bit line leak check or an open-circuit check and the like. Conversely, a defective column can be detected by such a technique, thus making it possible to bring the step of defective column detection prior to the step of Vpgm initial value trimming.

A specific method of defective column detection/replacement will be described below. First, a configuration of a circuit concerning defective column detection/replacement will be described here.

Figure 18:
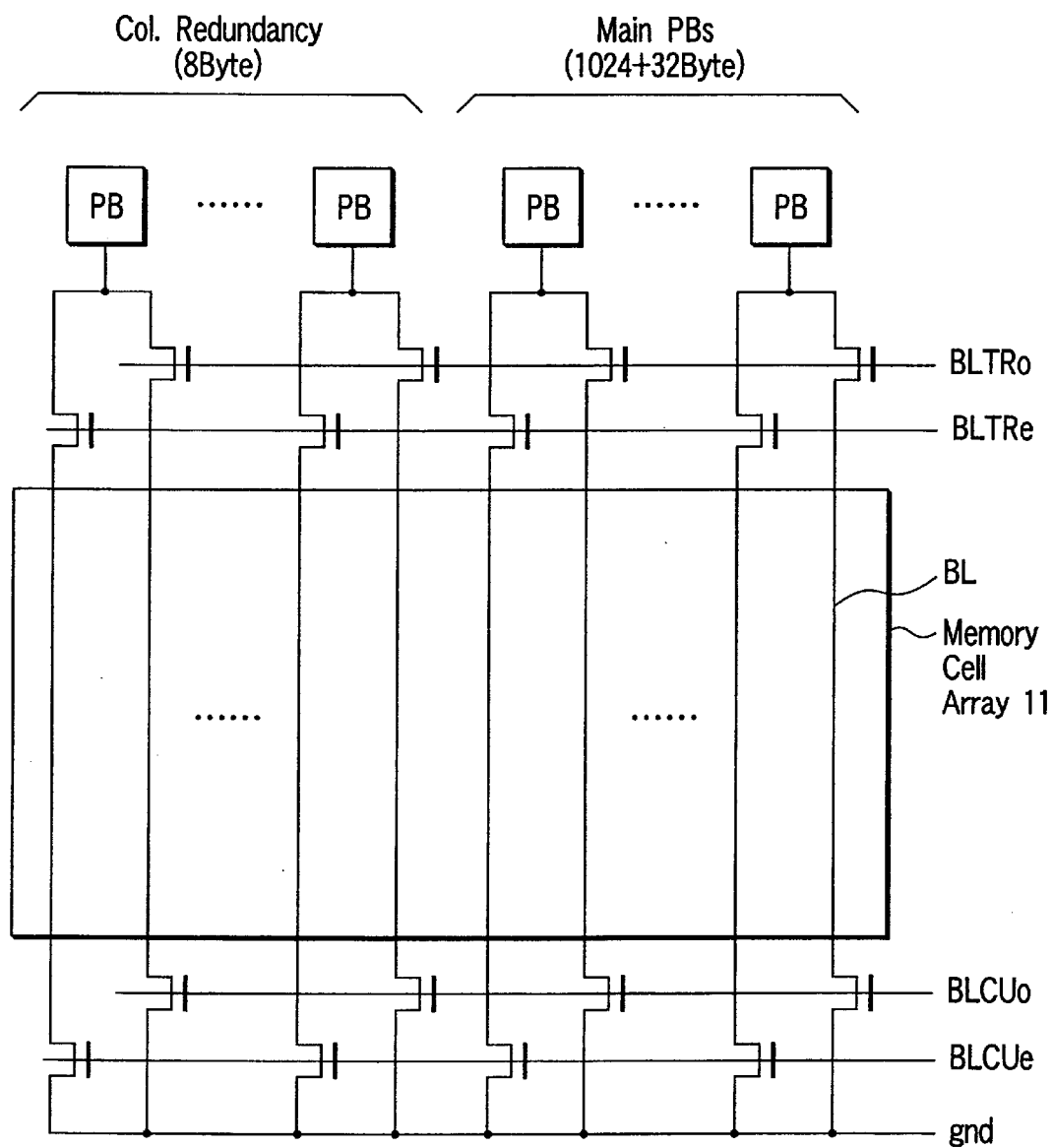
FIG. 18 is a circuit diagram showing an outline of part of a memory cell array 11 and a page buffer 13 shown in FIG. 1.

FIG. 18 shows an outline of part of the memory cell array 11 and the page buffer 13 shown in FIG. 1. Here, one page of the memory cell array 11 comprises 1,056 bytes=1024+32. Data is inputted/outputted in units of bytes, and thus, a column address has 11 bits from A0 to A10. A defective column in a main region is replaced with a column redundancy in units of bytes. The column redundancy has 8 bytes for one plane. In addition, two bit lines BL are assigned to one page buffer (PB). A connection line is determined depending on signal lines BLTRe, BLTRo, BLCUe, and BLCUo. For example, when BLTRe="H", and BLTRo="L", an even number bit line BL is connected to the page buffer PB. At this time, the setting is BLCUe="L" and BLCUo="H", and a non-selected bit line BL is connected to aground (gnd). An even number bit line and an odd number bit line are regarded as belonging to separate pages.

Figure 19:
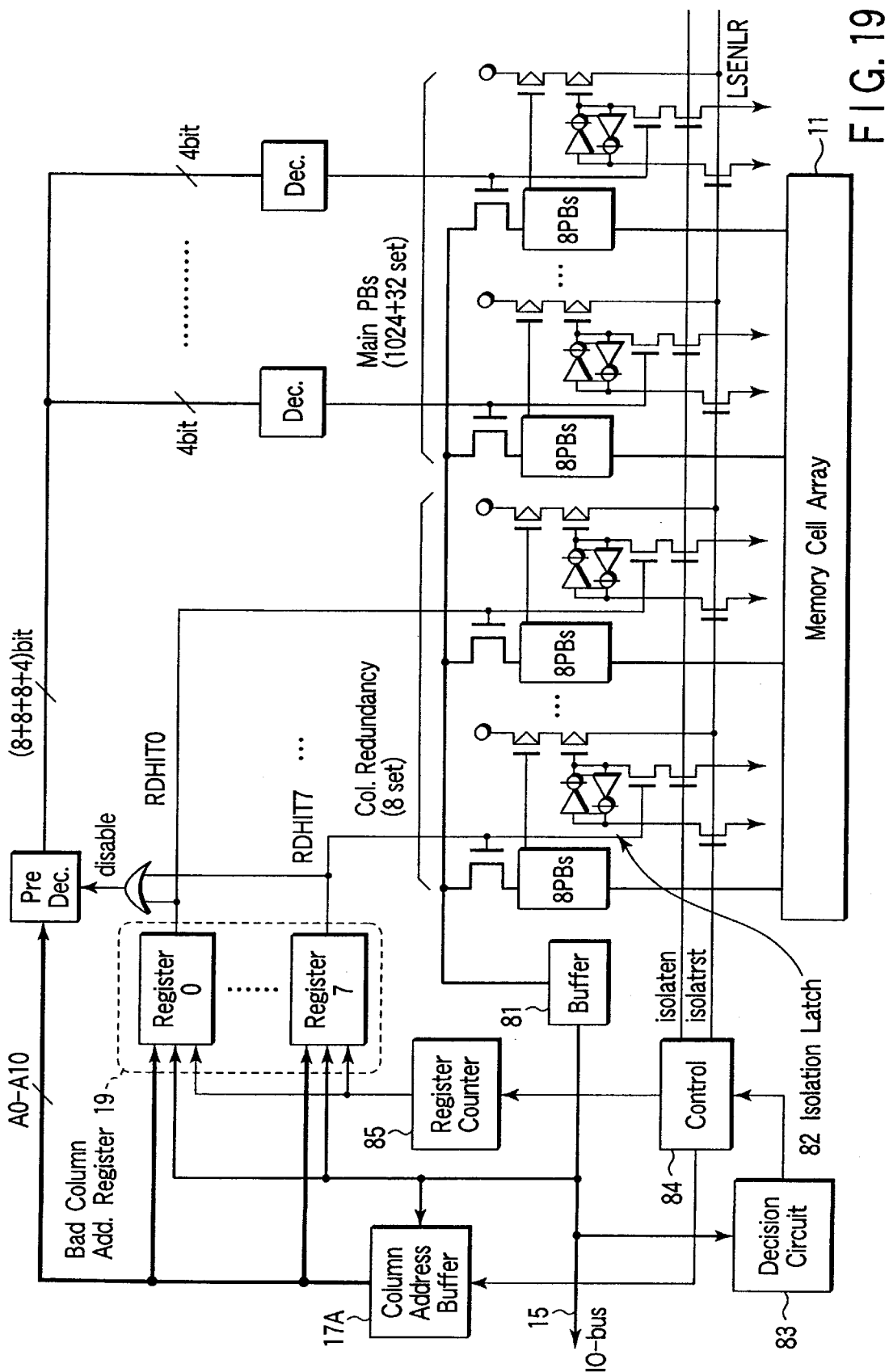
FIG. 19 is a circuit diagram showing a configuration of a circuit relating to column redundancy in the memory shown in FIG. 1.

FIG. 19 shows a configuration of a circuit relating to a column redundancy in the memory shown in FIG. 1. At a stage when operations for defective column detection and replacement complete, a defective column address is stored in the defective column address register 19. If a column address inputted to the column address buffer 17A that is a part of the address buffer 17 coincides with an address in the defective column address register 19, a main column region is non-selected, and a redundancy region is selected.

During readout operation, data contained in the selected eight (one byte) page buffers PB are outputted to the I/O bus 15 via a buffer circuit (Buffer) 81. When write data is inputted (data load) in the page buffer PB, data is transferred in a path which is reversed from the above.

A signal line LSENLR shown in FIG. 19 is used during batch sensing operation. At this time, in order to ensure that a defective column or information contained in a column redundancy region is not reflected in batch sensing operation, it is required to interrupt a signal path between these page buffers PB and the signal line LSENLR. An isolation latch circuit (Isolation Latch) 82 provided for each of the eight page buffers PB is intended to store information indicating whether or not the above signal path is interrupted.

In FIG. 19, reference numeral 83 denotes a judgment circuit (Decision Circuit) for judging data outputted to the I/O bus 15 via the buffer circuit 81; reference numeral 84 denotes a control circuit (Control); and reference numeral 85 denotes a register counter (Register Counter).

Figure 20:
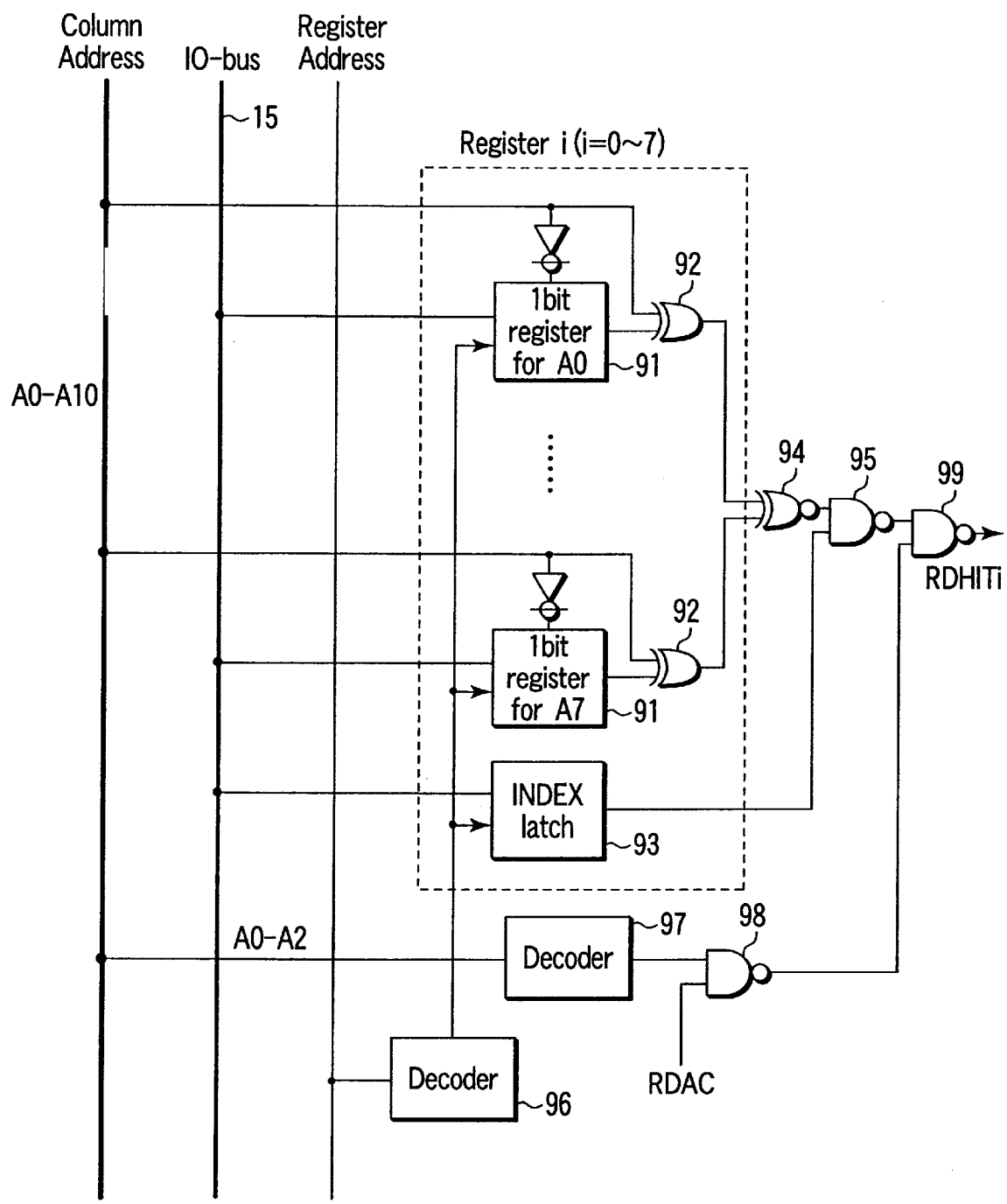
FIG. 20 is a circuit diagram showing a circuit configuration of one unit of a defective column address register 19 shown in FIG. 19.

FIG. 20 shows a circuit configuration in one unit of the defective column address register 19 shown in FIG. 19. One of the defective column addresses A0 to A10 is stored in a circuit in unit o such one unit, and a latch circuit 91 for 11 bits is included. Whether or not the column address inputted to the column address buffer 17A coincides with an address stored in the defective column address register 19 is judged by means of an EX-OR circuit (exclusive logical summation circuit) 92 provided for each of the 11 latch circuits 91. A latch circuit 93 stores an index pit (INDEX). This index bit serves as an index for judging whether or not data stored in another 11 latch circuits 91 is valid. In the case where data "1" is stored in the latch circuit 93, it indicates that the data contained in the latch circuit 91 is a defective column address. In the case where data "0" is stored, it indicates that the data contained in the latch circuit 91 is invalid.

An output of the above EX-OR circuit 92 is inputted in parallel to a NOR circuit 94. An output of this NOR circuit 94 is inputted to a NAND circuit 95, and further, the data stored in the above latch circuit 93 is supplied to this NAND circuit 95. Reference numerals 96 and 97 each denote a decoder, and reference numerals 98 and 99 each denote a NAND circuit. A detailed description of the circuit shown in FIG. 20 will be given later.

Now, a sequence for defective column detection and replacement will be described here.

Figure 21:
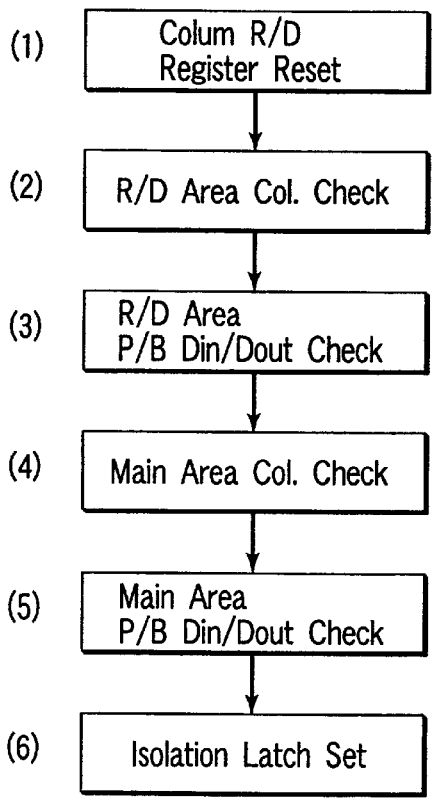
FIG. 21 is a flowchart showing sequences for defective column detection and replacement in the memory shown in FIG. 1.

FIG. 21 is a flowchart of a defective column detection and replacement sequence. This step has the following six portions.

(1) Column Redundancy Register Reset (Column, R/D Register Reset)

This step resets all defective column address registers. In addition, an index latch circuit are set to all "0"s.

(2) Redundancy Region Column Check (R/D Area Co. Check)

Figure 22:
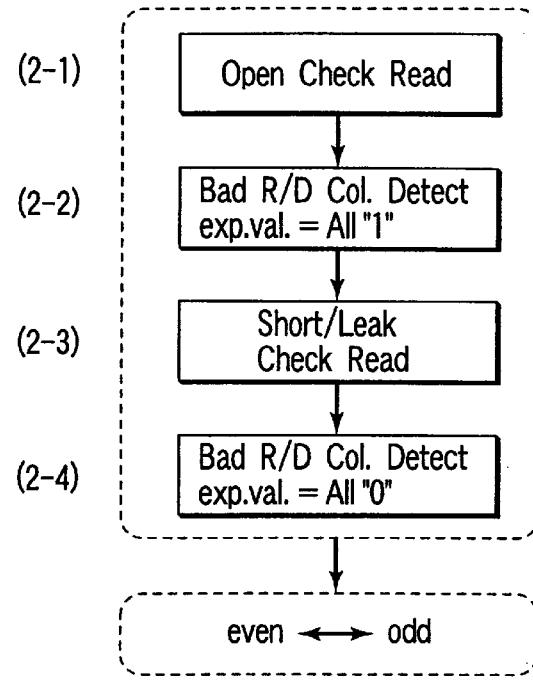
FIG. 22 is a flowchart showing a step of column check of a redundancy region in the memory shown in FIG. 1.

A defective column in a redundancy region is detected prior to detecting a defect in a main column region so that a defective redundancy column is not selected. This step comprises four steps as shown in FIG. 22.

(2-1) Open-circuit Check Read (Open Check Read)

This step carries out readout (reading) for detecting an open-circuit defect with a bit line. Thus, all the blocks are non-selected, and reading is carried out while the gates of the transistors connected to BLCUe and BLCUo shown in FIG. 18 are open-circuited altogether. If a bit line BL is cut in a memory cell array 1, data "0" (corresponding to a cell placed in an OFF state) is read out in the page buffer PB. If not, data "1" (corresponding to a cell placed in an ON state) is read out. The readout time is set to be shorter than during reading for normal operation in order to detect a state in which a bit line BL is almost cut, and enters a high resistance. This read operation is read for all the bit lines of even number (even) and odd number(odd) at the same time. Thus, readout is first carried out for an even number bit line, and then, readout is carried out an odd number bit line.

(2-2) Faulty Redundancy Column Detection (Bad R/D Col. Detect)

Figure 24:
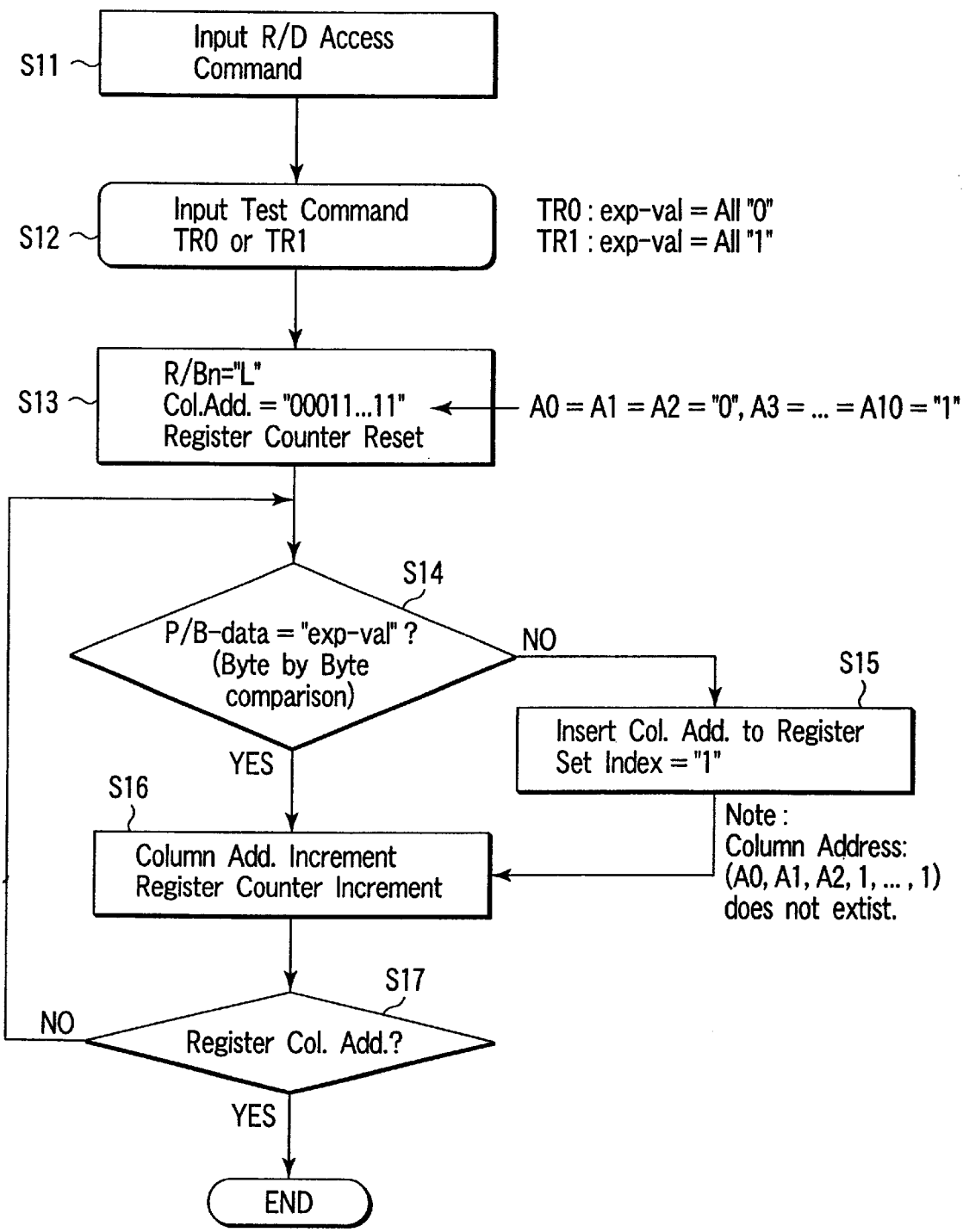
FIG. 24 is a flowchart showing an operation for detecting and registering a column with its open-circuit defect, of a column of a redundancy region in the memory shown in FIG. 1.

An open-circuit defect column of the columns in a redundancy region is detected and registered. The flowchart of this operation is shown in FIG. 24. First, a command is inputted so as to enable direct access to a column redundancy region (step S11). In this manner, a signal RDAC shown in FIG. 20 is set so as to enable selection of a column redundancy in the least significant 3 bits A0 to A2 in the column address. Namely, the signal RDAC is set to "H", whereby an output of a NAND circuit 98 is determined according to an output of a decoder 97 for decoding the least significant 3 bits A0 to A2 of the column address, and further, a redundancy signal RDHITi is set via a NAND circuit 99.

Subsequently, a test command TR1 is inputted (step 12). TR0 is a test command that detects whether or not the page buffer data in the redundancy region are set to all "0"s. TR1 is a test command that detects whether or not the page buffer data in the redundancy region are set to all "1"s. The expected values (exp-val) of the page buffer data when the test command TR0 is inputted are set to all "0"s. The expected value (exp-val) of the page buffer data when the test command 1 is inputted are set to all "1"s. In the flowchart shown in FIG. 24, the thick arrow represents a transition caused by external command input, and represents automatic transition caused by a control circuit in a chip.

When a command is inputted, an R/Bn (ready/busy) signal is set to "L" at the step S13. Then, the column address buffer 17A and register counter 85 shown in FIG. 19 are reset. In the column address buffer 17A, A0, A1, and A2 are set to "0"s, and the remains are reset to all "1"s ("00011 . . . 1").

Next, the page buffer data in the selected redundancy is transferred to a judgment circuit 83 via a buffer circuit 81 shown in FIG. 19, and it is judged whether or not the data are set to all "1"s (step S14). If the judgment result is negative, it denotes that an open-circuit defect occurs with such column, and the column cannot be used as a redundancy.

In this case, at the next step S15, the data contained in the column address buffer 17A is stored in the latch circuit 91 in a circuit in one unit in a defective column address register 19 selected by the resistor counter 85, and an index bit (INDEX) of the latch circuit in a circuit for one unit is set to "1". The thus stored address (all "1"'s other than A0, A1, and A2) does not actually exist in a memory cell region. Therefore, even if any address is inputted in the column address buffer 17A during normal operation, such address is not replaced with this column redundancy.

On the other hand, if the judgment circuit 83 judges that all "1"s are set, the column address buffer 177A and register counter 85 are incremented altogether at the next step S16, and the next column redundancy is selected. The above operation is repeated to the last column redundancy. When it is judged that processing reaches the last column redundancy at the step S17, the sequence terminates.

(2-3) Short/Leak Check Read (Short/Leak Check Read)

This step carries out reading for detecting a defect due to shorting or leakage between bit lines. Thus, all blocks are non-selected, and reading is carried out. The read time is set to be longer than that of normal operation in order to provide a margin.

If a column is normal, data "0" is read out in a page buffer. If a short-circuit or leakage occurs, data "1" is read out.

(2-4) Faulty Redundancy Column Detection (Bad R/D Col. Detect)

This step detects and registers a short-circuit or leakage defect column of the columns in the redundancy region. If the column is normal, the data "0" should be inputted in a page buffer (expected value "xp-val.=All "0"), and thus, a command TR0 is inputted. The contents of sequence is similar to those of the above item (2-2).

After the above operation has terminated, even and odd of a bit line is inverted, and operation similar to (2-1) to (2-4) is repeated. The even and odd of the bit line can be specified by a dedicated address.

(3) [Data Input/Output Check Relevant to Page Buffer in Redundancy Region (R/D Area P/B Din/Dout Check)]

Data loading and data readout are carried out for a page buffer in a redundancy region, thereby checking that a page buffer logic circuit is free of a defect (stuck-at-defect). Specifically, data "1" is first loaded in all the page buffers. Then, operation similar to (2-2) shown in FIG. 22 is made, thereby detecting/registering a defect. Next, data "1" is loaded, and operation similar to (2-4) shown in FIG. 22 is made.

At the foregoing step, all the defective columns in the redundancy region are assumed to have been detected/registered. For a register in a redundancy judged as a defect, "1" is set to INDEX.

(4) [Main Area Column Check (Main Area Col. Check)]

Figure 23:
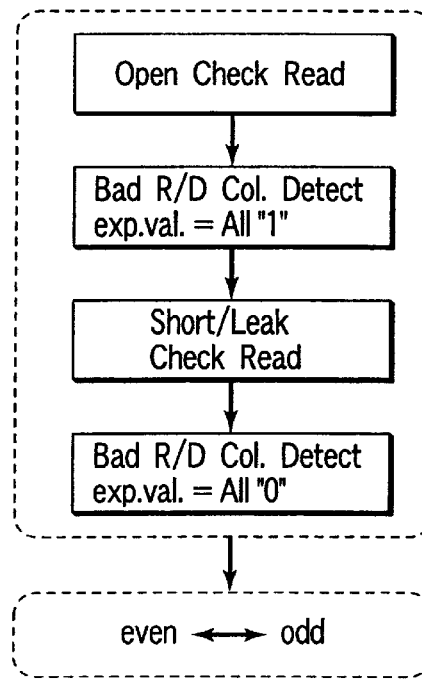
FIG. 23 is a flowchart showing sequences of open-circuit/short-circuit/leak defect detection/replacement in the memory shown in FIG. 1.

Next, a defective column in a main region is detected, and is replaced with a redundancy column. First, detection replacement of an open-circuit defect and short-circuit/leakage defect (Bad Column Detection & Repair) is carried out. This sequence is shown in FIG. 23. The steps of open-circuit defective detection reading, short-circuit/leakage defect detection reading are completely identical to that shown in FIG. 24.

Figure 25:
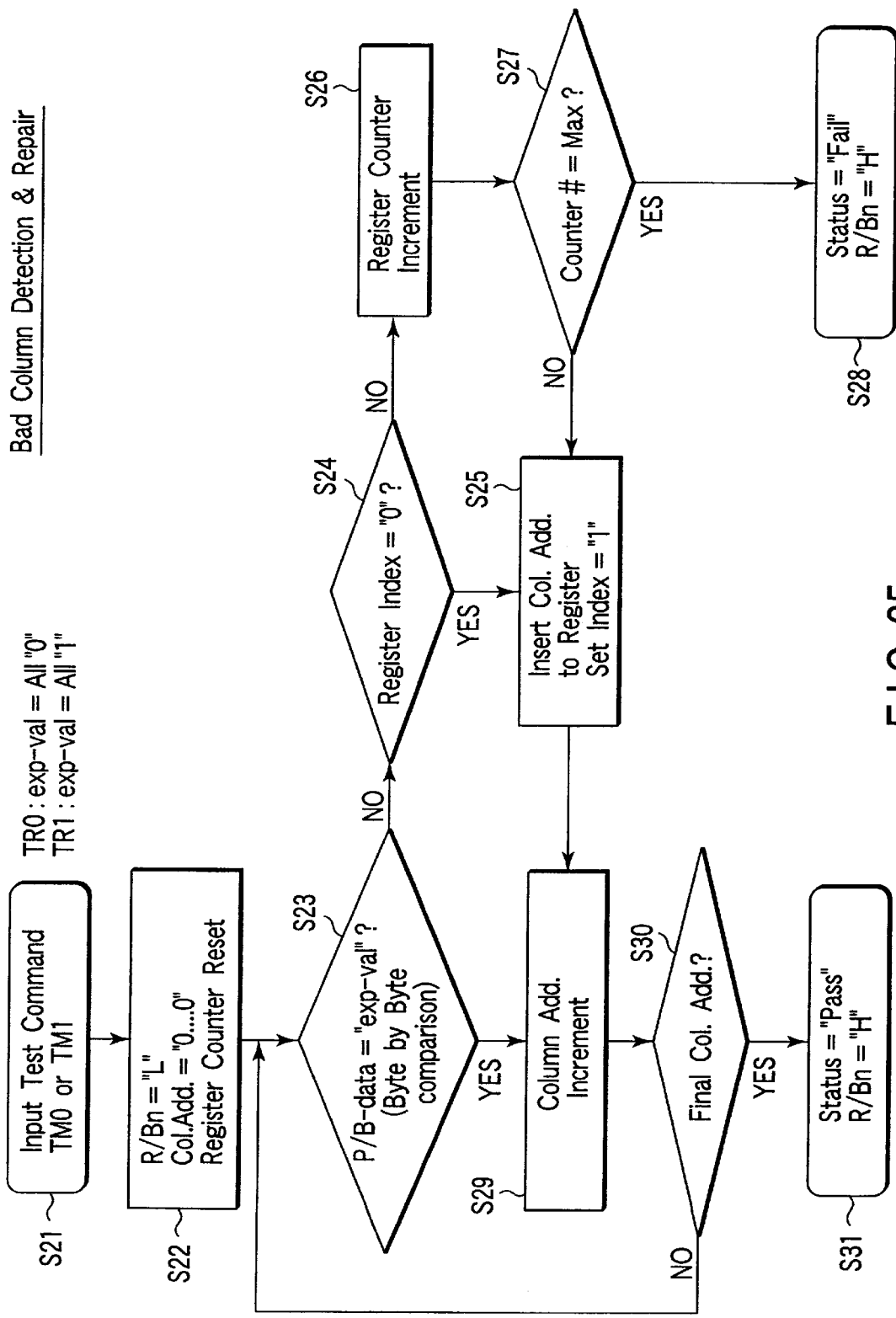
FIG. 25 is a flowchart showing a defect detection/replacement operation in the memory shown in FIG. 1.

A flowchart of defect detection/replacement operation is shown in FIG. 25. A command TR0 or TR1 is inputted according to whether an expected value (xxp-va. "0" or "1" is detected (step S21).

Next, at the step S22, the setting is R/Bn="L", and the column address buffer 17A and register counter 85 shown in FIG. 199 are reset. Then, in the column address buffer 17A, the starting address of the main region is selected. Next, at the step S23, data contained in the page buffer PB for each byte is detected (Byte by Byte comparison). If the data contained in the page buffer PB is different from the expected value, an index bit (INDEX) of the register selected at this time is checked at the step S24. When INDEX="0", a defective address is stored in that register at the step S25, and the setting is INDEX="1".

At the step S24, when INDEX="1", it denotes that a defect occurs with a redundancy or that such redundancy is already used. At the step S26, the register counter 85 is incremented. Then, at the step S27, a register with INDEX="0" is searched. If a register with INDEX="0" does not exist after the counter has been incremented up, a flag "Fail" is set at a status (Status) latch at the step S28. After the end of testing, the status latch state can be recognized by status latch reading.

On the other hand, when the data contained in the page buffer PB coincides with the expected value at the step S23 and when the step S25 terminates, the column address is incremented at the step S29. Then, at the step S30, when redundancy replacement terminates normally (Final Col. Add is detected), a flag "Pass" is set at a status latch at the next step S31.

(5) Data Input/Output Check Relevant to Page Buffer in Main Region (Main Area P/B Din/Dout Check)

Then, a defect with a page buffer logic circuit in a main region is detected. Fault detection and replacement are carried out in accordance with a flowchart shown in FIG. 25.

(6) Setting Isolation Latch Circuit (Isolation Latch Set)

After redundancy replacement has completed, an isolation latch circuit 82 shown in FIG. 19 is set. First, a command is inputted, and an isolation latch reset signal "isolatrst" outputted from a control circuit 84 is set to "H". In this manner, all the page buffers PB shown in FIG. 19 is isolated from a batch sensing line LSENLR. Next, an isolation latch enable signal "isolation" outputted from the control circuit 84 is set to "H". In this state, data for one page is loaded. When a column is selected, data contained in the isolation latch circuit 82 is inverted. An address for one page is scanned, whereby the setting of the isolation latch circuit 82 is completed.

An operation for defective column detection and replacement has now been completed. So far, a description has been given with respect to a case in which one memory plane is provided. In the case where a plurality of planes are provided, easy extension can be obtained.

Now, the step of (5) normal memory block search (Good Block Search) in a flowchart shown in FIG. 3 will be described here.

It is required to carry out a writing operation for determining a Vpgm initial value in write erasable blocks. Then, normal memory block search is carried out.

Figures 26, 27:
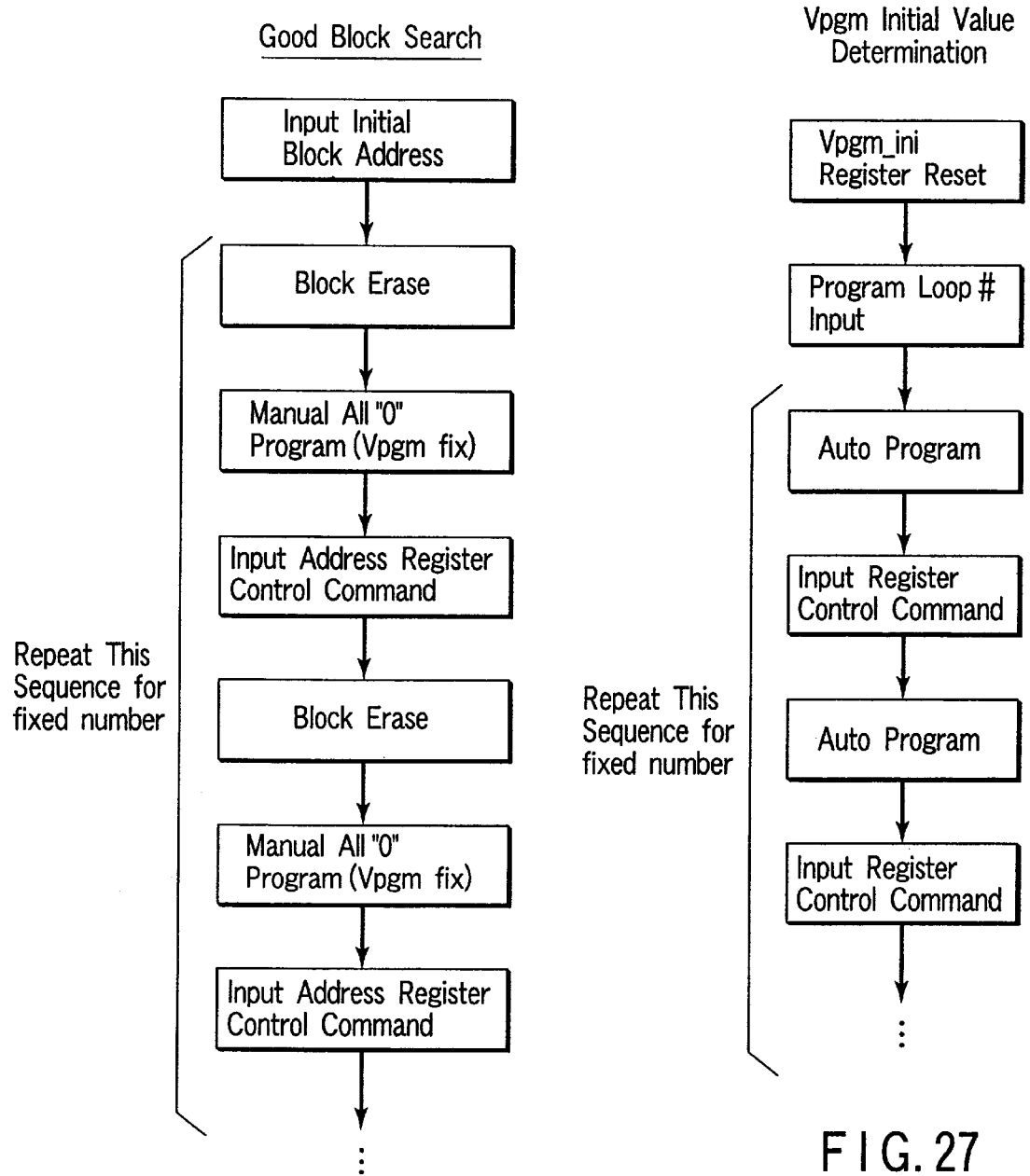
FIG. 26 is a flowchart showing a sequence for searching a normal memory block in the memory shown in FIG. 1.
FIG. 27 is a flowchart showing a sequence for Vpgm initial value trimming in the memory shown in FIG. 1.

A sequence of this step is shown in a flowchart of FIG. 26. First, a proper initial block address is inputted (Input Initial Block Address). An initial block address may not be a starting block address. Next, a block erasure command is inputted, and this block is erased (Block Erase).

Following erasing operation, a erasure verification (checking that all "1"s are set by batch sensing) is carried out, and the result is stored in a first status register provided at a control circuit 25 or the like shown in FIG. 1.

Next, a manual program command (Manual Program) is inputted, and all "0"s are written into a selected page. In this manual program, the write loop count is defined as one, and Vrgm is defined as a maximum value or a value close to the maximum value. After programming, a verify operation is carried out, and the result is stored in a second status register provided in the control circuit 25 or the like (Manual All "0" Program (Vpgm fix)).

Subsequently, an address register control command is inputted (Input Address Register Control Command). In this manner, one or both of the contents of the above first and second status registers is "fail" (Fail), a block address is incremented. The contents of both of the status registers are "pass" (Pass), they are retained in that address.

As described above, instead of checking a status states of the first and second status registers, the above operation may be made by using one status register such that the pass/fail results are cumulatively stored. That is, the result of immediately preceding erasure or write verification is "pass", no register data is changed. If the result is "fail", a status register is provided such that a register state is forcibly set to a first signal state. In the case where this register data is "fail", the block address is incremented. If erasure/writing is carried out after this status register has been first set to a "pass" state, when either of erasure and writing is "fail", this register is placed in a "fail" state. Therefore, a function similar to the above can be achieved by one status register.

A sequence from block erasure to address register control command input is repeated in a predetermined number. As a result, at a time when the sequence terminates, an address of a normal memory block (Good Block) of each chip is entered in a block address buffer. This operation enables complete parallel operation as in the case of timer trimming or voltage trimming. An address register control command serves as a register control command in timer trimming or voltage trimming.

Next, the step of (6) Vpgm initial value trimming (Vpgm Initial Value Trimming) in the flowchart shown in FIG. 3 will be described here.

FIG. 27 is a flowchart showing a sequence for this Vpgm initial value trimming.

First, a register for storing a Vpgm initial value is reset (Vpgm initial Register Reset). This register functions as a counter in the same way as the register shown in FIG. 8. When an increment signal is generated from a control circuit, the data contained in a register is incremented.

Next, a desired program loop count is inputted, and inputted count is stored in a predetermined register (Program Loop # Input). When an auto program (Auto Program) is executed, Vpgm is stepped up by inputted loop count. The pass/fail (Pass/Fail) information after programming is stored in the second status register.

When a register control command is inputted at this stage (Input Register Control Command), if a program status is "fail" (Fail), the register value of the Vpgm initial value is incremented. When the status is "pass" (Pass), the register state is maintained. Therefore, after a group of the auto program and register control has been repeated in a predetermined number, the Vpgm initial value is inputted to the Vpgm initial value register such that writing terminates in a desired program loop count.

Figure 28:
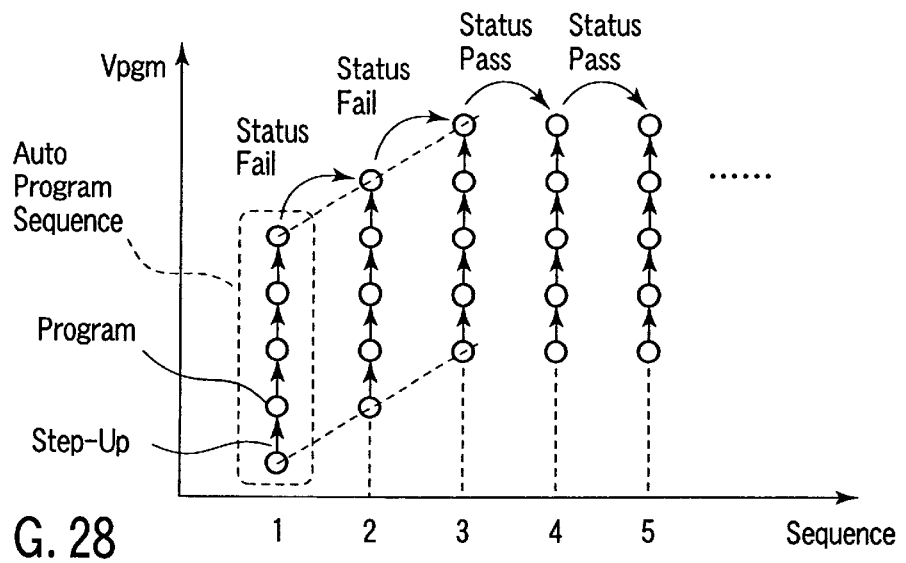
FIG. 28 is a view showing how a writing voltage Vpgm changes in the sequence shown in FIG. 27.

FIG. 28 shows how a writing voltage Vpgm changes in the above sequence. Here, the program loop count is set to 5. In a first write sequence (Sequence), the Vpgm initial value is set to a minimum value. From the minimum value, the Vpgm value is stepped up 4 times (Step Up), then the status is judged. While the status is "fail" (Status Fail), the vpgm initial value is continuously incremented. When the status is "pass" (Status Pass), the Vpgm initial value keeps its state. Therefore, after this sequence has been repeated in a predetermined number, the Vpgm initial value is set to an optimal value according to such chip.

During programming, a non-selected word line voltage Vpass as well is stepped up.

The initial value of Vpass may be set so as to change together with the Vpgm initial value.

Although a description has been given with respect to only a method of optimizing the Vpgm initial value, the initial value of the erasure voltage Verase can be optimized in the similar way as required.

Now, the step of (7) defective memory block detection (Bad Block Detection) in the flowchart shown in FIG. 3 will be described here.

In a NAND type flash memory, a flag FLAG (Bad Block Flag) is set to a defective block, and redundancy replacement is not carried out. Hereinafter, a sequence for detecting a defective block and setting a flag "Flag" will be described.

Figure 29:
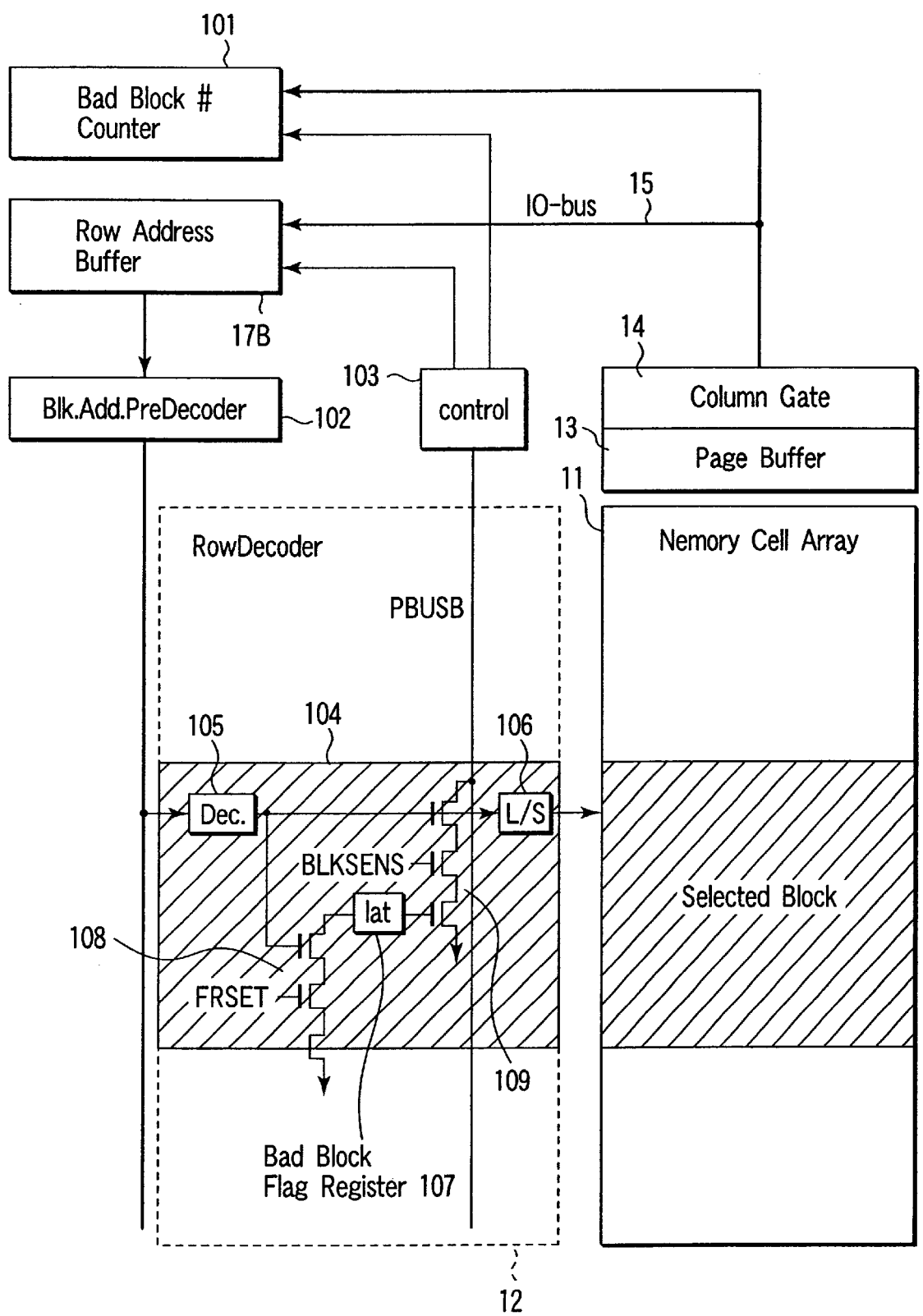
FIG. 29 is a circuit diagram showing a configuration of a circuit relating to a block defect detection system shown in FIG. 1.

FIG. 29 shows a circuit configuration relating to a block defect detecting system in FIG. 1.

In FIG. 29, reference numeral 101 denotes a defective block count counter (Bad Block # Counter); reference numeral 17B denotes a row address buffer that configures a part of the address buffer 17; reference numeral 102 denotes a block address pre-decoder (Blk Address PreDecoder) that decodes an output of the row address buffer 17B; PBSB denotes a wire; and reference numeral 103 denotes a control circuit that detects a signal of this wire, where an output of this control circuit 103 and an output of a column gate circuit 14 via an I/O bus 15 are supplied to the above defective block count counter 101 and row address buffer 17B.

Here, a partial decoder circuit 104 in number corresponding to a memory block in the memory cell array 11 is provided at the row decoder 12. The partial decoder circuits 104 each comprises: a decoder circuit (Dec.) 105 that decodes an output of the above block address pre-decoder 102; a level shift circuit (L/S) 106 that level converts an output of this decoder circuit 105, and supplies the converted output to the corresponding memory cell block; a defective block flag register (Bad Block Flag Register) 107; a setter circuit 108 that comprises two N-channel MOS transistors connected in series for setting this defective block flag register 107 based on an output of the above decoder circuit 105 and a flag register set signal FRSET; and a readout circuit 109 that comprises three N-channel MOS transistors connected in series for reading out the contents of the defective block flag register 107 based on an output of the above decoder circuit 105 and a register sense signal BLK-SENS.

Figure 30:
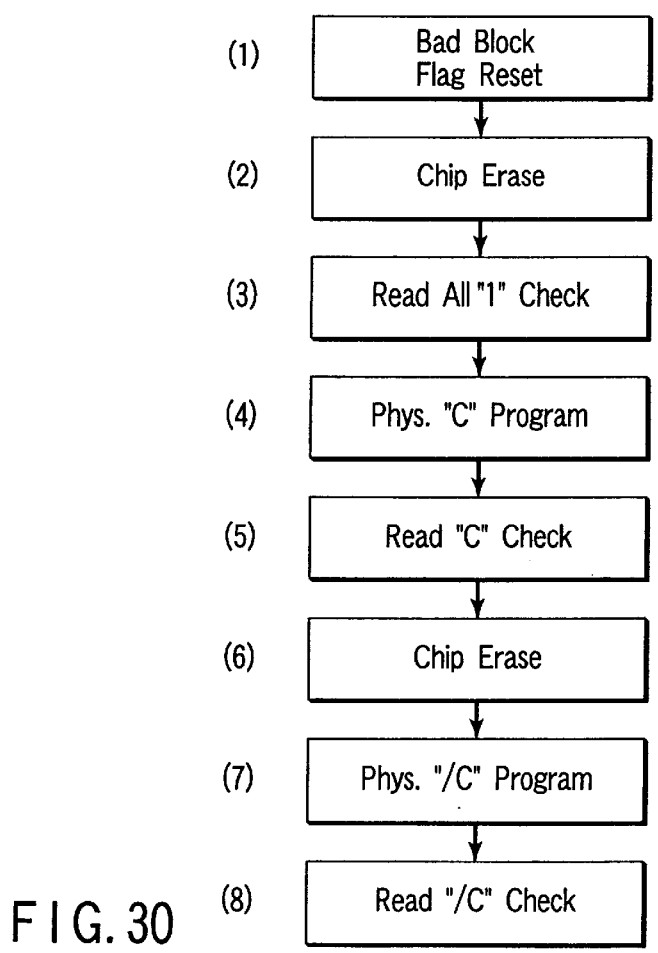
FIG. 30 is a flowchart showing procedures for defective block detection shown in FIG. 1.

In addition, FIG. 30 is a sequence for defect block detection (Bad Block Detection). In FIG. 30, all 1 read check (Read All "1" Check) reads out and checks data "1" from all the memory cells. A checker pattern (Checker Pattern) read check (Read "C" Check) reads out and checks data when data "0" and data "1" are arranged in a lattice shape. Further, an inversion checker pattern check (Read "/C" Check) reads and checks a checker pattern in which data "1" and data "0" are complementary to the checker pattern.

At a stage at which this detection test is carried out, a column redundancy has already been replaced, and optimization of write erasure voltage has been completed. Therefore, if readout data fails at this time, such defect is regarded as a defective block. In this case, even if a defect caused by a single cell, such defect is regarded as a defective block.

Hereinafter, a sequence operation will be described in order.

(1) Faulty Block Flag Register Reset (Bad Block Flag Reset)
All the defective block flag registers 107 are reset.

(2) Chip Erasure (Chip Erase)
Here, all cell data are erased. The chip erasing operation is carried out by repeating block erasure in all blocks.

Figure 31:
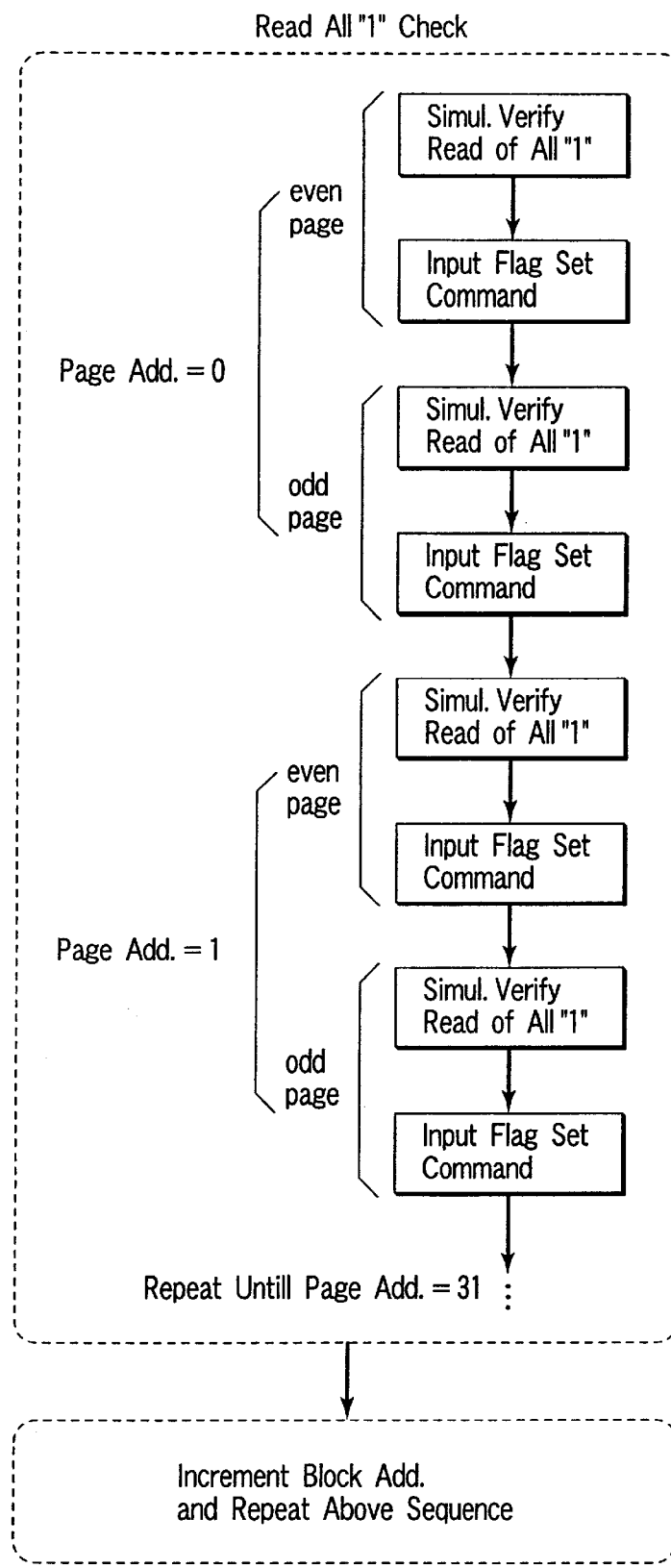
FIG. 31 is a flowchart showing procedures for "1" data readout check during defective block detection.

(3) Data "1" Readout Check (Read All "1" Check)
It is checked that cell data are placed in a erased state ("1"). First, an address of a starting block is specified, and the specified address is detected in accordance with the procedures shown in FIG. 31. The starting page is read, and batch sensing operation is made. If it is judged that all "1"s are not set in batch sensing, a flag "fail" (Fail) is set at a status register. Then, a flag set command (Flag Set Command) is inputted. In this manner, if a status is "fail", a flag is set at the defect block flag register 107 that corresponds to the block. This flag is set by setting a signal FRSET shown in FIG. 29 to "H". This operation is repeated for an even number page (Even Page) and an off number page (Odd Page), and then, a page address (Page Address) is incremented. Processing is terminated when the incrementing reaches the last page of the cell array.

(4) Physical Checker Pattern Program (Phys. "C" Program)
A physical checker pattern is written into all memory cells.

Figure 32:
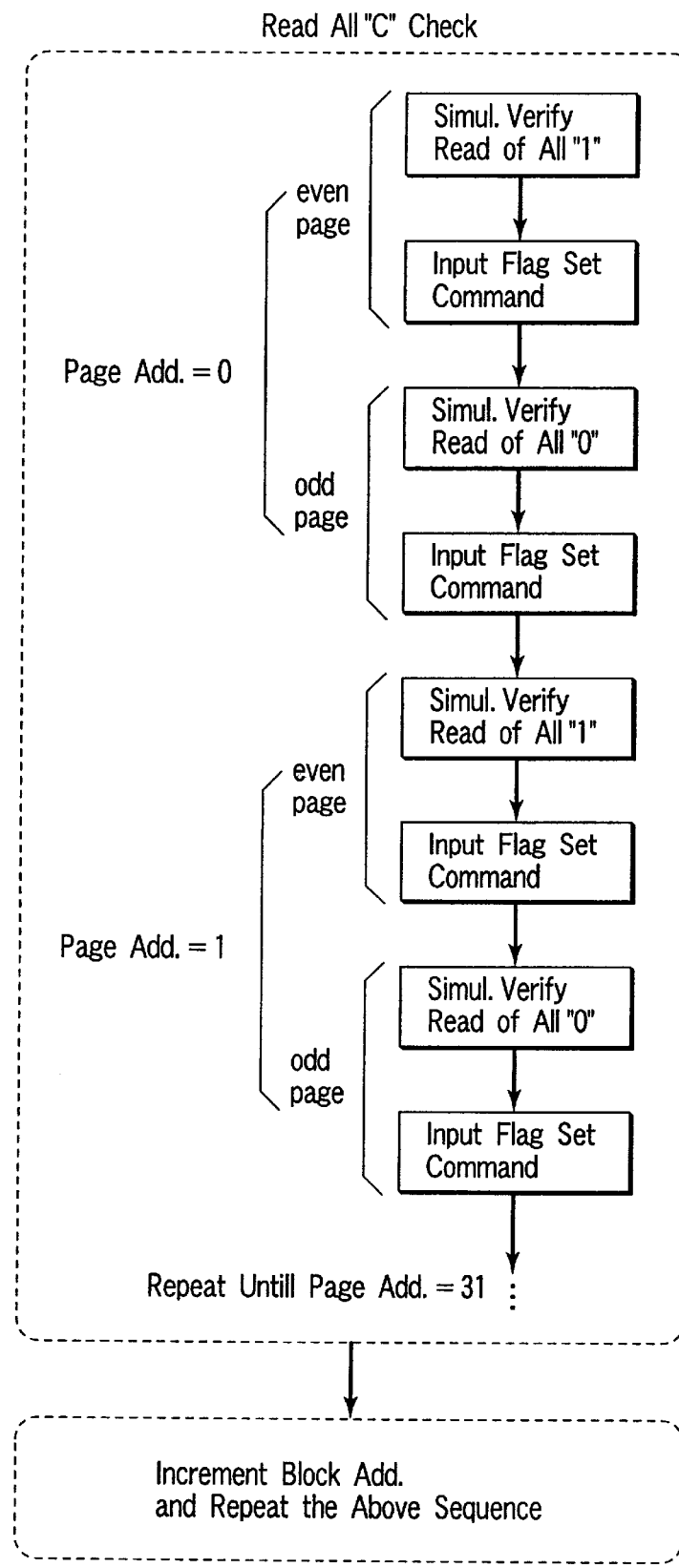
FIG. 32 is a flowchart showing procedures for readout check of a physical checker pattern during defective block detection.

(5) Physical Checker Pattern Readout Check (Read All "C" Check)
A checker pattern is read in accordance with the procedures shown in FIG. 32. If a defect is detected, a flag is set at a defective block flag register 107 that corresponds to that block. This operation is identical to the above case of (3) except that read patterns are different from each other. In a physical checker pattern, data "1" and "0" are written into an even number (Even) bit line and an odd number (Odd) bit line. Thus, for example, when an even number page (Even Page) is read out, all data "1" or "0" are read out. Therefore, a checker pattern check can be made by utilizing batch sensing operation.

(6) Chip Erasure (Chip Erase)
All cell data are erased in the same manner as in the case of (2), and a pattern written in (4) is erased.

(7) Physical Checker Pattern ("/C") Program (Phys. "/C" Program)
Physical checker pattern "/C" is written into all memory cells.

(8) Physical Checker Pattern Readout Check (Read All "/C")
In the same manner as in the case of (5), "/C" is read. If a defect is detected, a flag is set at the block flag register 107 that corresponds to that block.

Figure 33:
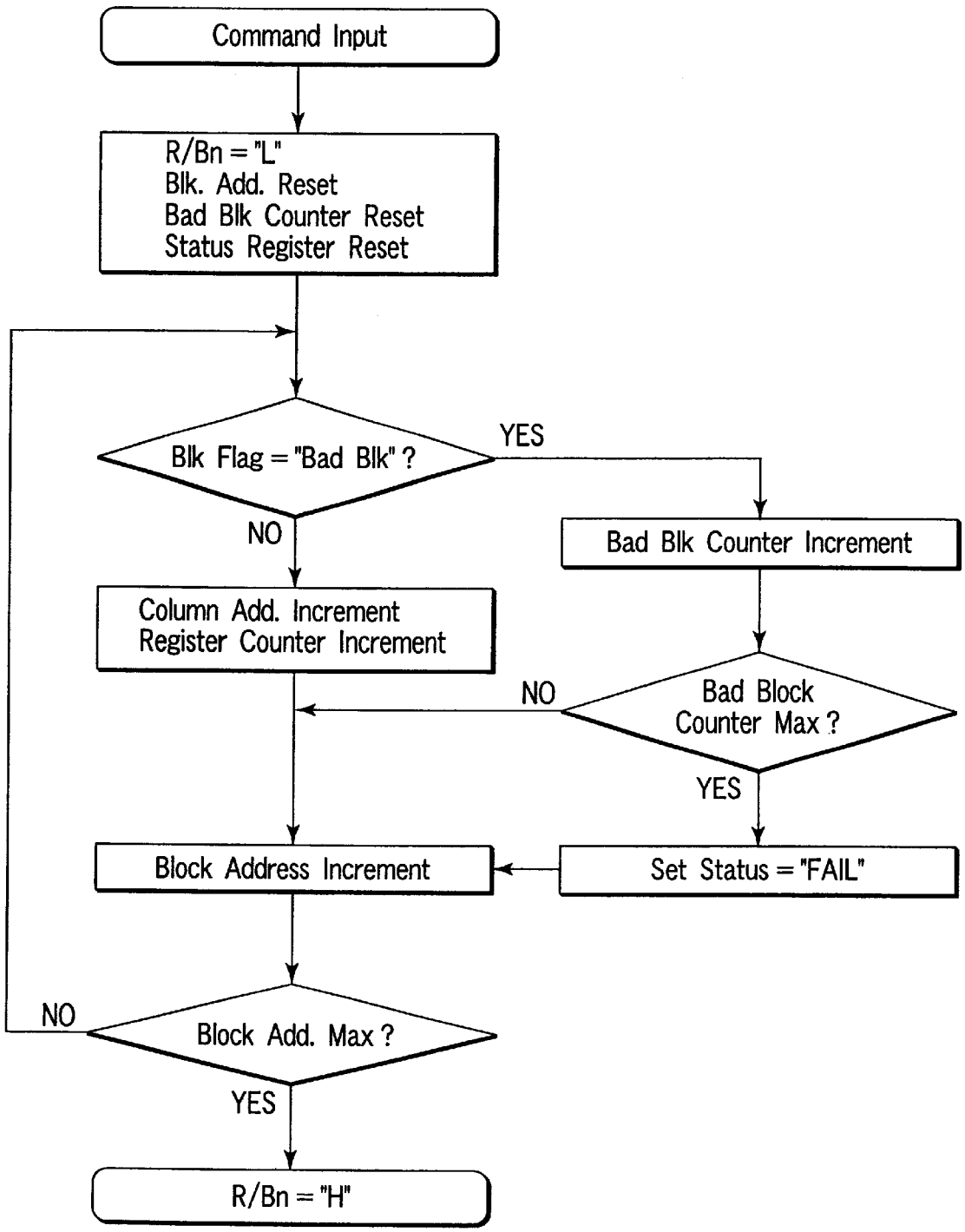
FIG. 33 is a flowchart showing a sequence for counting the number of flags for a defective block after defective block detection.

The upper limit of defective blocks in number is predetermined in accordance with a specification. Thus, in order to check whether the number of defects detected by a sequence for defective block detection (Bad Block Detection), the flag counting sequence (Bad Block Flag # Count) of the defective flag shown in FIG. 33 is run. As to whether or not a flag is set at the defective block flag register 107 that corresponds to a selected block, whether or not a wire PBUSB is discharged may be detected by means of a control circuit 103 by pre-charging the wire PBUSB shown in FIG. 29 by thee control circuit 103, and setting the register sense signal BLKSENS to "H".

Now, the step of (8) option set (Option Set) in the flowchart shown in FIG. 3 will be described here.

By the foregoing operation, of the data stored in an initialization data region of the memory cell array 11, information concerning a variety of trimming or a defective cell array section is determined. In the initialization data region, there is written information concerning chip option (Option), for example, and information on whether or not chips are used as a multi-valued article or a two-valued article and the like. Such information is inputted from a tester to each chip at this time. The inputted data is stored in a predetermined register.

Now, the step of (9) ROM fuse program (ROM-Fuse Program) in the flowchart shown in FIG. 3 will be described here.

Here, the data stored in each register are sequentially transferred to a page buffer, and then, the transferred data are written into an initialization data region. After writing has completed, power is temporarily turned OFF, and is turned ON again. In a chip, power ON is sensed, data is read out from the initialization data region, and the read out data are sequentially transferred to each register. In this manner, information concerning a variety of trimmings or a defective cell array section is reflected on subsequent chip operation. If necessary, a variety of voltages and timers are monitored in order to check this, and memory cell writing/erasing/readout operation is made.

Now, a second embodiment according to the present invention will be described here.

Testing having all the same structures is carried out for timer trimming, voltage trimming, vpgm initial value trimming, normal memory block search, and defective block detection of the above test steps. That is, first, a first command is inputted to carry out testing, and the pass/fail information is outputted as a status or flag. Next, when a second command is inputted, a group of the first command and second command is repeated in a predetermined number, whereby information according to characteristics for each chip can be acquired.

This method can be carried out by assigning a command to a plurality of chips. Thus, a complete parallel test can be carried out, and a test time can be reduced. In addition, there is no need to provide a tester memory, and there is no need to make computation for data acquired by the CPU in the tester, thus eliminating a high performance tester.

However, in the case of the above described timer trimming or voltage trimming, it is required to repeat $2^N$ tests in order to determine an N-bit register trimming value. Therefore, if N is greater, the test time is longer.

Figure 34:
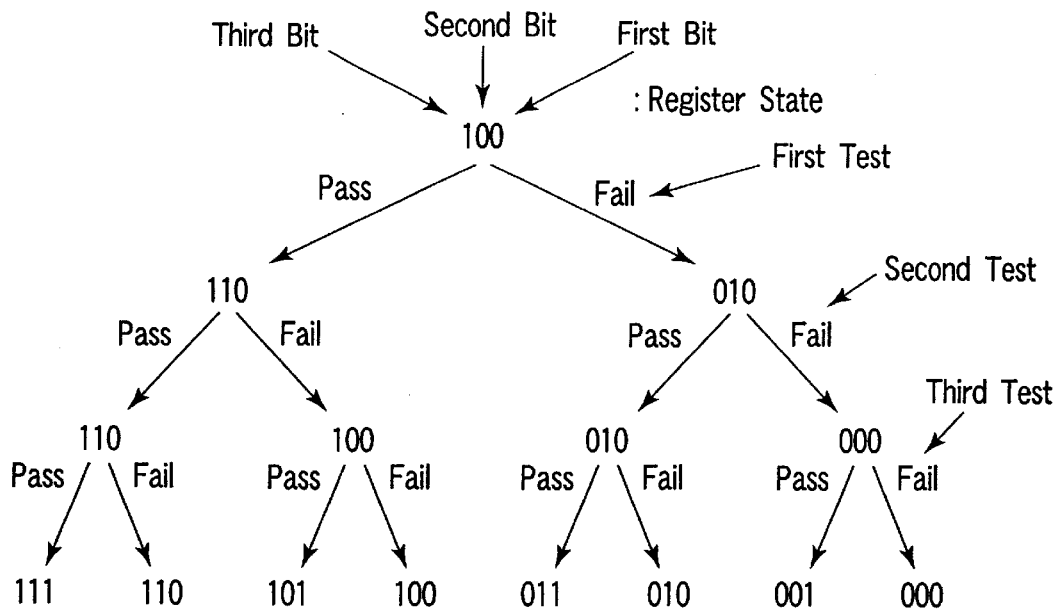
FIG. 34 is a view illustrating a testing method according to a second embodiment of the present invention.
Figure 35:
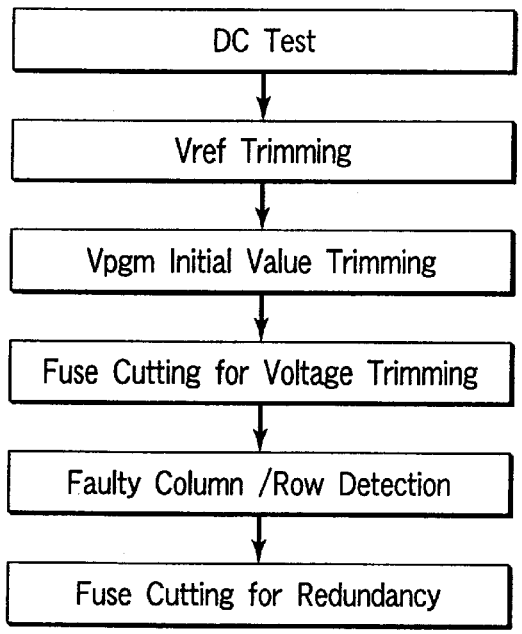
FIG. 35 is a flowchart showing an outline of a conventional wafer test step.

In such a case, the method described below is employed, thereby making it possible to reduce the test time FIG. 34 shows how register data changes with this method when N=3. Hereinafter, a description will be given by way of example when timer trimming is carried out.

First, the register is set to (TTMR2, TTMR1, TTMR0)= (1, 0, 0), testing for comparing the previously mentioned Tint and Text with each other, and TTMR2 at a third bit is set to "1" and "0", respectively according to the result of "pass" (Tint>Text) and "fail" (Tint<Test).

Next, a second test is carried out by setting the remaining 2 bits (TTMR1, TTMR0)=(1, 0), and a second bit is set. By doing this, as shown in FIG. 34, the third bit, second bit, and first bit are sequentially set through three tests.

By employing such a testing method, only N tests are required to determine an N-bit register trimming value, and the test time can be reduced.

The present invention is not limited to the above described embodiments each. At the stage of embodiment, various modifications can occur without departing from the spirit of the invention.

As has been described, the semiconductor device and testing method are employed, whereby a complete parallel test can be carried out, and the test time for the semiconductor storage device can be reduced. In addition, there is no need to provide a tester memory, and there is no need to make computation for data acquired by the tester CPU. Thus, a high performance tester is eliminated, and the testing cost can be reduced. In addition, the testing method according to the present invention can be achieved merely by introducing a comparatively small scale of circuits. Thus, a substantial increase in chip area due to employment of this testing method does not occur.

In general, a wafer test sequence is optimized according to product properties. In the case of so called BIST (Built In Self Test), the testing step is incorporated in advance in a circuit, thus, making it difficult to change a test sequence according to product properties. However, in the testing method according to the present invention, each test item is initiated by command input, and a test sequence with its flexibility can be constructed. For example, in the case where there is a small amount of deviation in timer circuit, the timer trimming test step may be deleted from the sequence. In addition, a defective address can be additionally registered with respect to a defective column or a defective block. Thus, a defect judged after a burn-in test has been carried out, for example, can be saved.

In this way, the semiconductor device and testing method according to the present invention are employed, making it possible to reduce the testing cost while maintaining flexibility in test sequence.

What is claimed is:

1. A semiconductor device comprising:

a bit line;

a plurality of memory cells connected to said bit line; and a sense amplifier connected to one end of said bit line; and a defect detector circuit configured to detect in a test mode an open-circuit defect or a short-circuit defect of said bit line by reading out data by said sense amplifier while setting all of the plurality of memory cells connected to said bit line to a non-selected state, and connection the other end of said bit line to a predetermined potential via a switch, and judging whether or not data read out by said sense amplifier is a predetermined logic level.

2. A semiconductor device comprising:

a memory cell array having a column region and a row region in which memory cells are arranged in column and row directions of a matrix;

a redundancy column region having M redundancy columns for replacement with a defective column in said memory cell array;

M registers for storing column addresses to be replaced with said redundancy columns, each of said M registers including a Latch placed to a first or second signal state according to whether or not a corresponding redundancy column can be used;

a sense amplifier;

a counter that selects said M registers sequentially;

a judgment circuit that makes a judgment on whether or not data of a selected column outputted from said sense amplifier coincides with a predetermined expected value and outputs a "pass" or "fail" signal according to a result of said judgment; and a control circuit that sets when a defective column in said memory cell array is to be detected in a test mode, a column address and said counter to a start address and thereafter performs following operations until said counter has reached an end column address, increments, if an output of said judgment circuit is "pass", said column address without registering said column address, stores, if said output of said judgment circuit is "fail" and said latch of said register selected by said counter is set in said first signal state, said column address in said register and thereafter increments said column address and said counter, increments, if said output of said judgment circuit is "fail" and said latch of said resister selected by said counter is placed in said second signal stare, said counter until said counter has reached a register whose latch is placed in said first signal state, thereafter, stores said column address in said register, and thereafter, increments said column address and said counter.

3. The semiconductor device according to claim 2, wherein said control circuit carries out an operation configured to detect a defect in said redundancy column region prior to an operation configured to detect a defective column in said memory cell array, and places said latch of said register in said second signal state, which register corresponds to a redundancy column in which a detect has been detected, and sets a column address in said register not to select said column region of said memory cell array.

4. A semiconductor device comprising:

a memory cell array in which programmable and erasable nonvolatile memory cells arc arranged in column and row directions of a matrix;

a sense amplifier;

a bit line extending in said column direction, for transmitting data of said memory cell array to said sense amplifier; and a column defect detecting circuit that detects in a test a mode 2 defective column of said memory cell array, without carrying out writing and erasing operation for said memory cells, by detecting whether or not open-circuit, a short-circuit, or a leak are presented in said bit line and said sense amplifier.

5. The semiconductor device according to claim 4, wherein detecting whether or not an open-circuit a short-circuit, or a leak are presented in said line and said sense amplifier is carried out by reading out data of said memory cell array by said sense amplifier while setting all of said memory cells connected to said bit line to a non-selected state, and connecting said bit line to a predetermined potential via a switch, and by judging whether or not data read out by said sense amplifier is a predetermined logic level.

6. A method of detecting arid replacing a defective column in a semiconductor device in a test mode, said semiconductor device comprising a memory cell array having a column region and a row region in which memory cells are arranged in column and row directions of a matrix; a redundancy column region having M redundancy columns for replacement with a defective column in said memory cell array; M registers for storing column addresses to be replaced with said redundancy columns, each of said M registers including a latch placed to a first or second signal state according to whether or not a corresponding redundancy column can be used; a sense amplifier; a counter that selects said M registers sequentially; and a judgment circuit that makes a judgment on whether or not data of a selected column outputted from said sense amplifier coincides with a predetermined expected value and outputs a "pass" or "fail" signal according to a result of said judgment, wherein, said method of detecting and replacing a defective column in a semiconductor device in a test mode comprising:

setting a column address and said counter to a starting address, when a defective column in said memory cell array is to be detected;

incrementing, if an output of said judgment circuit is "pass", said column address without storing said column address, storing, if said output of said judgment circuit is "fail" and said latch of said register selected by said counter is placed in said first signal state, said column address in said register and thereafter incrementing said column address and said counter incrementing, if said output of said judgment circuit is "fail" and said latch of said register selected by said counter is placed in said second signal state, said counter until said counter has reached a register whose lath is placed in said first signal state thereafter, storing said column address in said register and thereafter, incrementing said column address and said counter; and carrying out said above operations until said counter has reached and end column address.

7. The method of detecting and replacing a defective column in a semiconductor device, according to claim 6, wherein a first operation configured to detect a defect in said redundancy column region is carried out prior to a second operation configured to detect a defective column in said memory cell array, and said latch of said register is placed in said second signal state, which register corresponds to a redundancy column in which a defect has been detected, and a column address is set in said register not to select said column region of said memory cell array.

* * * * *

UNITED STATES PATENT AND TRADEMARK OFFICE
CERTIFICATE OF CORRECTION

PATENT NO.    : 6,643,180 B2
DATED         : November 4, 2003
INVENTOR(S)   : Tamio Ikehashi et al.

It is certified that error appears in the above-identified patent and that said Letters Patent is hereby corrected as shown below:

Column 26,
Line 3, "connection" has been replaced with -- connecting --;
Line 17, "Latch" has been replaced with -- latch --;
Line 41, "resister" has been replaced with -- register --;
Line 42, "stare" has been replaced with -- state --;
Line 53, "detect" has been replaced with -- defect --;
Line 58, "arc" has been replaced with -- are --;
Lines 65-66, "in a test a mode 2" has been replaced with -- in a test mode a --;

Column 27,
Line 1, -- an -- has been inserted after "whether or not";
Line 6, -- bit -- has been inserted after "presented in said";
Line 13, "arid" has been replaced with -- and --;

Column 8,
Line 14, "lath" has been replaced with -- latch --.

Signed and Sealed this

Twenty-third Day of March, 2004

JON W. DUDAS
*Acting Director of the United States Patent and Trademark Office*